US007710120B2

(12) United States Patent
Yudahira et al.

(10) Patent No.: US 7,710,120 B2
(45) Date of Patent: May 4, 2010

(54) ABNORMAL VOLTAGE DETECTOR APPARATUS FOR DETECTING VOLTAGE ABNORMALITY IN ASSEMBLED BATTERY

(75) Inventors: Hirofumi Yudahira, Ibusuki (JP); Toshiaki Nakanishi, Toyohashi (JP)

(73) Assignee: Panasonic EV Energy Co., Ltd., Kosai-Shi (JP)

( * ) Notice: Subject to any disclaimer, the term of this patent is extended or adjusted under 35 U.S.C. 154(b) by 0 days.

(21) Appl. No.: 12/400,137

(22) Filed: Mar. 9, 2009

(65) Prior Publication Data

US 2009/0174411 A1 Jul. 9, 2009

Related U.S. Application Data

(62) Division of application No. 11/184,690, filed on Jul. 19, 2005, now Pat. No. 7,521,896.

(30) Foreign Application Priority Data

Jul. 20, 2004 (JP) ............... 2004-212225

(51) Int. Cl.
*G01N 27/02* (2006.01)
*H02J 7/00* (2006.01)
*H02J 7/14* (2006.01)
*G08B 21/00* (2006.01)

(52) U.S. Cl. ............... 324/433; 324/434; 320/104; 320/133; 320/150; 340/636.17

(58) Field of Classification Search ............... 324/433, 324/434
See application file for complete search history.

(56) References Cited

U.S. PATENT DOCUMENTS

| 5,130,699 | A | | 7/1992 | Reher et al. | |
|---|---|---|---|---|---|
| 5,302,902 | A | * | 4/1994 | Groehl | 324/434 |
| 5,705,914 | A | * | 1/1998 | Morita | 340/636.17 |
| 5,796,334 | A | * | 8/1998 | Chen et al. | 340/539.3 |
| 6,064,179 | A | | 5/2000 | Ito et al. | |
| 6,462,550 | B2 | * | 10/2002 | Yudahira | 324/426 |
| 6,870,372 | B2 | | 3/2005 | Koga et al. | |
| 2002/0075015 | A1 | * | 6/2002 | Morimoto et al. | 324/672 |
| 2003/0052688 | A1 | * | 3/2003 | Yudahira et al. | 324/429 |

(Continued)

FOREIGN PATENT DOCUMENTS

JP 04-160370 6/1992

(Continued)

*Primary Examiner*—Patrick J Assouad
*Assistant Examiner*—Yalkew Fantu
(74) *Attorney, Agent, or Firm*—Workman Nydegger

(57) ABSTRACT

An abnormal voltage detector apparatus is provided for an assembled battery including a plurality of battery blocks connected in series to each other. In the abnormal voltage detector apparatus, a detecting part detects whether or not each of the battery blocks is in a voltage abnormality state by comparing either one of a voltage of each battery block and each battery measuring voltage, that is a voltage lowered from the voltage of each battery block, with a predetermined reference voltage, generates each of abnormality detecting signals containing information about a detected result, calculates a time ratio of a time interval, for which the assembled battery is in a voltage abnormality state, to a predetermined time interval, based on the abnormality detecting signals, and detects a voltage abnormality of the assembled battery based on a calculated time ratio.

7 Claims, 16 Drawing Sheets

U.S. PATENT DOCUMENTS

2004/0001996 A1 * 1/2004 Sugimoto .................. 429/61

FOREIGN PATENT DOCUMENTS

| JP | 05-508229 | 11/1993 |
|---|---|---|
| JP | 07-035786 | 2/1995 |
| JP | 07-035833 | 2/1995 |
| JP | 07-120509 | 5/1995 |
| JP | 09-159701 | 6/1997 |
| JP | 11-326401 | 11/1999 |
| JP | 2002-357625 | 12/2002 |
| JP | 2003-248022 | 9/2003 |
| JP | 2003-297407 | 10/2003 |
| JP | 2003-303626 | 10/2003 |

* cited by examiner

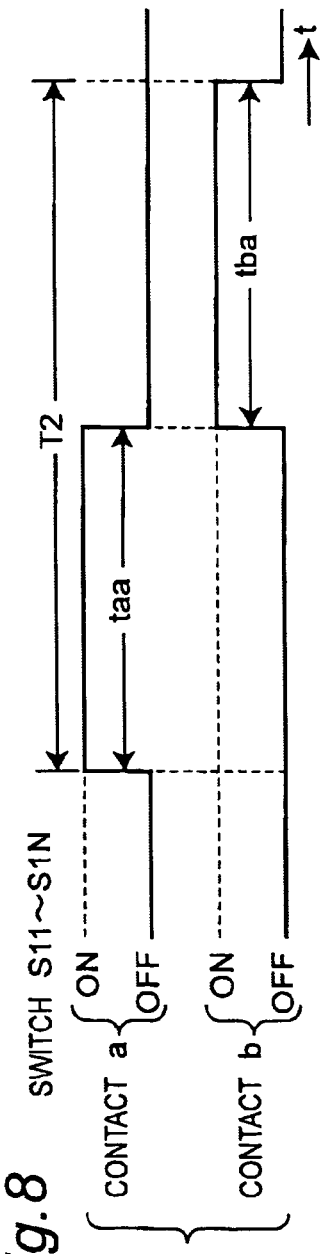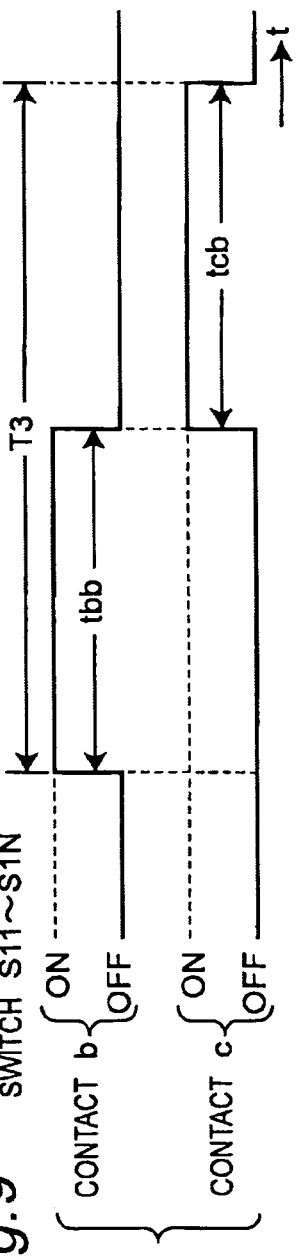

ABNORMAL VOLTAGE DETECTOR APPARATUS FOR DETECTING VOLTAGE ABNORMALITY IN ASSEMBLED BATTERY

This application is a divisional of U.S. patent application Ser. No. 11/184,690 filed Jul. 19, 2005 which claimed priority to Japanese patent application number 2004-212225 filed Jul. 20, 2004 which are incorporated herein by reference.

BACKGROUND OF THE INVENTION

1. Field of the Invention

The present invention relates to an abnormal voltage detector apparatus for use in an assembled battery, and in particular, to an abnormal voltage detector apparatus for detecting voltage abnormality in the assembled battery.

2. Description of the Related Art

A sealed nickel-metal hydride battery (hereinafter referred to as a "nickel-hydrogen battery") is excellent in basic characteristics, such as energy density, output density and cycle life. Accordingly, in recent years, attention has been given to such a nickel-hydrogen battery as a power source for motors and as a drive source for various kinds of loads in electric vehicles, such as pure electric vehicles (PEVs) and hybrid electric vehicles (HEVs). Development has been thus advancing to make such a nickel-hydrogen battery practical.

When the nickel-hydrogen battery is used as a power source for electric vehicles, a total voltage of approximately 100 V to 350 V is required to obtain a predetermined drive output voltage. The output voltage of a cell, which is the minimum unit constituting the nickel-hydrogen battery, is approximately 1.2 V. Therefore, an assembled battery including a plurality of battery blocks, each battery block including at least one cell, is used to obtain a desired total voltage.

The temperatures of the cells constituting the assembled battery are not uniform. In particular, in such an environment that the assembled battery is used in a vehicle, temperature differences may occur among the cells. Furthermore, the remaining capacity and the charging efficiency (the ratio of the charged electric quantity to the supplied electric quantity) of respective cells are different from each other depending on production process and usage conditions after the production. For these reasons, the cells constituting the assembled battery have variations in the actual remaining capacity (SOC: state of charge), and the range of the capacity usable as the capacity of the assembled battery is narrowed. In other words, the service life of the assembled battery is apparently shortened significantly. In the assembled battery, it is important to detect the voltage of each cell or battery block constituting the assembled battery, and to judge whether or not the voltage is abnormal to carry out charging or discharging control.

The Japanese patent laid-open publication No. 2003-303626-A discloses an abnormal detector apparatus for an assembled battery according to a prior art. The abnormal detector apparatus according to the prior art includes abnormal detector circuits, each of which provided in each battery block that constitutes the assembled battery and detects whether or not a voltage between terminals is abnormal such as overcharged or overdischarged. The abnormal detector apparatus according to the prior art transmits an abnormal voltage detection signal to a charge and discharge controller side when at least one of the abnormal detector circuits detects that the voltage is abnormal.

According to the abnormal detector apparatus according to the prior art, if one abnormal detector circuit fails and cannot detect an abnormal voltage even when, for example, a corresponding battery block has an overvoltage, it is such a possibility that the assembled battery is continuously used without any user's knowledge of the failure of the abnormal voltage detector circuit and that the battery block is eventually overcharged.

The Japanese patent laid-open No. 9-159701-A discloses overvoltage detector apparatus for use in an assembled battery according to another prior art. The overvoltage detector apparatus according to this prior art can detect overvoltage of each cell or battery block that constitutes the assembled battery and can determine whether an overvoltage detection function is normal or abnormal.

The abnormal detector apparatus and overvoltage detector apparatus according to the prior art have one threshold voltage, respectively, which is a boundary value at which the voltage is abnormal or not, for detecting whether or not the battery block is abnormal. Due to this, even if one battery block that constitutes the assembled battery has a voltage closer to the threshold voltage and is about to be overdischarged or overcharged, for example, the abnormal voltage detection signal is not outputted to the outside unit. As a result, a notification that the battery is abnormal is suddenly displayed at the moment when the voltage of the battery block exceeds the threshold voltage or falls below the threshold voltage.

The abnormal detector apparatus and overvoltage detector apparatus according to the prior art cannot detect voltage abnormality of the assembled battery accurately and reliably when a voltage of the battery block fluctuates with elapsed time.

SUMMARY OF THE INVENTION

An essential object of the present invention is therefore to provide an abnormal voltage detector apparatus for use in an assembled battery including a plurality of battery blocks connected in series, capable of detecting a voltage abnormality of the assembled battery with a high accuracy and reliability, as compared with the prior art.

Another object of the present invention is to provide an abnormal voltage detector apparatus capable of testing or checking whether or not the abnormal voltage detection function operates normally.

In order to achieve the aforementioned objective, according to one aspect of the present invention, there is provided an abnormal voltage detector apparatus for use in an assembled battery. The abnormal voltage detector apparatus detects voltage abnormality in the assembled battery. The assembled battery includes a plurality of battery blocks connected in series to each other, and each battery block includes at least one secondary battery. The abnormal voltage detector apparatus includes a detecting part. The detecting part detects whether or not each of the battery blocks is in a voltage abnormality state by comparing either one of a voltage of each battery block and each battery measuring voltage, that is a voltage lowered from the voltage of each battery block, with a predetermined reference voltage, and generates each of abnormality detecting signals containing information about a detected result. Then the detecting part calculates a time ratio of a time interval, for which the assembled battery is in a voltage abnormality state, to a predetermined time interval, based on the abnormality detecting signals, and detects a voltage abnormality of the assembled battery based on a calculated time ratio.

In the above-mentioned abnormal voltage detector apparatus, the detecting part preferably compares each of the battery measuring voltages that are the voltage lowered from the voltage of each battery block with a plurality of reference voltages.

In the above-mentioned abnormal voltage detector apparatus, the detecting part preferably generates each of the battery measuring voltages by dividing the voltage of each battery block by using a constant voltage source.

In the above-mentioned abnormal voltage detector apparatus, the detecting part preferably compares each of battery measuring voltages that are a plurality of voltages lowered from the voltage of each battery block with the reference voltage.

In the above-mentioned abnormal voltage detector apparatus, the voltage abnormality state is such a state that the battery measuring voltage of at least one of the battery blocks is higher than the reference voltage. When the detecting part detects the voltage abnormality of the assembled battery by comparing each of battery measuring voltages with a first reference voltage, the detecting part preferably detects the voltage abnormality of the assembled battery by comparing each of the battery measuring voltages with a second reference voltage, which is higher than the first reference voltage.

In the above-mentioned abnormal voltage detector apparatus, when the detecting part detects the voltage abnormality of the assembled battery by comparing each of battery measuring voltages with the second reference voltage, the detecting part preferably detects the voltage abnormality of the assembled battery by comparing each of the battery measuring voltages with a third reference voltage, which is higher than the second reference voltage.

In the above-mentioned abnormal voltage detector apparatus, the voltage abnormality state is a state that the battery measuring voltage of at least one of the battery blocks is lower than the reference voltage. When the detecting part detects the voltage abnormality of the assembled battery by comparing each of battery measuring voltages with a first reference voltage, the detecting part preferably detects the voltage abnormality of the assembled battery by comparing each of the battery measuring voltages with a second reference voltage, which is lower than the first reference voltage.

In the above-mentioned abnormal voltage detector apparatus, when the detecting part detects the voltage abnormality of the assembled battery by comparing each of battery measuring voltages with the second reference voltage, the detecting part preferably detects the voltage abnormality of the assembled battery by comparing each of the battery measuring voltages with a third reference voltage, which is lower than the second reference voltage.

In the above-mentioned abnormal voltage detector apparatus, the detecting part preferably relatively changes either one of each of the battery measuring voltages of each battery block and the reference voltage, generates each of the abnormality detecting signals by comparing each of battery measuring voltages with the reference voltage, and detects whether or not the detecting part operates normally based on the abnormality detecting signals.

In the above-mentioned abnormal voltage detector apparatus, the detecting part preferably further includes voltage changing circuits, a signal generator, a serial-parallel converter, and a level converter circuit. Each of the voltage changing circuits changes either one of each of the battery measuring voltages of each battery block and the reference voltage. The signal generator generates a serial signal including control signals for controlling an operation of each of the voltage changing circuits. The serial-parallel converter converts the serial signal into parallel signals. The level converter circuit converts a voltage level of each of voltage levels of at least one of the control signals of the parallel signals into each of converted voltage levels thereof, that is a voltage level of said each battery block, respectively, by utilizing voltage differences each between electrodes of each transistor, and outputs the parallel signals having converted voltage levels to the voltage changing circuits as the control signals.

In the above-mentioned abnormal voltage detector apparatus, voltage levels of the parallel signals preferably include a voltage of negative terminal of the assembled battery. The level converter circuit boosts each of voltage levels of the parallel signals stepwise by a unit voltage, which is a voltage between the terminals of each of the battery blocks, to convert the voltage levels thereof into each of the converted voltage levels, respectively.

In the above-mentioned abnormal voltage detector apparatus, voltage levels of the parallel signals preferably include a voltage of a negative terminal of the assembled battery. The level converter circuit includes a first booster circuit and a second booster circuit. The first booster circuit boosts the voltage level of the parallel signals for a first battery block of the battery blocks only by a unit voltage, which is a voltage between the terminals of each of the battery blocks, to convert the voltage level thereof into the converted voltage level. The second booster circuit boosts the voltage level of the parallel signals for a second battery block of the battery blocks by the plurality of the unit voltages, to convert the voltage level thereof into the converted voltage level.

In the above-mentioned abnormal voltage detector apparatus, the level converter circuit preferably further includes a third booster circuit for boosting the voltage level of the parallel signals for a third battery block of the battery blocks by the unit voltage and then boosting a boosted voltage level thereof by the plurality of unit voltages to convert the voltage level thereof into the converted voltage level.

In the above-mentioned abnormal voltage detector apparatus, the serial signal preferably contains a start bit as a header thereof, and the serial-parallel converter automatically activates an internal oscillator in response to the start bit, and reads therein the serial signal outputted from said signal generator by using a predetermined clock outputted from the internal oscillator.

In the above-mentioned abnormal voltage detector apparatus, the detecting part preferably further includes first transmission devices and a second transmission device. Each of the first transmission devices transmits the abnormality detecting signal in an electrically insulted state. The second transmission device transmits the serial signal to the serial-parallel converter in an electrically insulted state.

Accordingly, the abnormal voltage detector apparatus for use in the assembled battery according to the present invention can detects the voltage abnormality of the assembled battery with high accuracy and reliability, as compared with the prior art. Because it generates each of abnormality detecting signals containing information about whether or not each of the battery blocks is in a normal state, calculates the time ratio of a time interval, for which the assembled battery is in a voltage abnormality state, to a predetermined time interval, based on the abnormality detecting signals, and detects the voltage abnormality of the assembled battery based on the calculated time ratio. Then the abnormal voltage detector apparatus for use in the assembled battery according to the present invention relatively changes either one of each of the battery measuring voltages of each battery block and the reference voltage, generates each of the abnormality detecting signals by comparing each of battery measuring voltages with the reference voltage, and can detect whether or not the detecting part operates normally based on the abnormality detecting signals.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 8 is a timing chart showing another operation of switches S11 to S1N at step S4 of FIG. 3;

FIG. 9 is a timing chart showing another operation of switches S11 to S1N at step S9 of FIG. 4;

DETAILED DESCRIPTION OF THE PREFERRED EMBODIMENTS

Preferred embodiments according to the present invention will be described below with reference to the attached drawings. Components similar to each other are denoted by the same reference symbols and will not be described herein in detail.

First Preferred Embodiment

Referring to FIGS. 1 to 10, an abnormal voltage detector apparatus 100 according to a first preferred embodiment of the present invention will be described.

Figure 1:
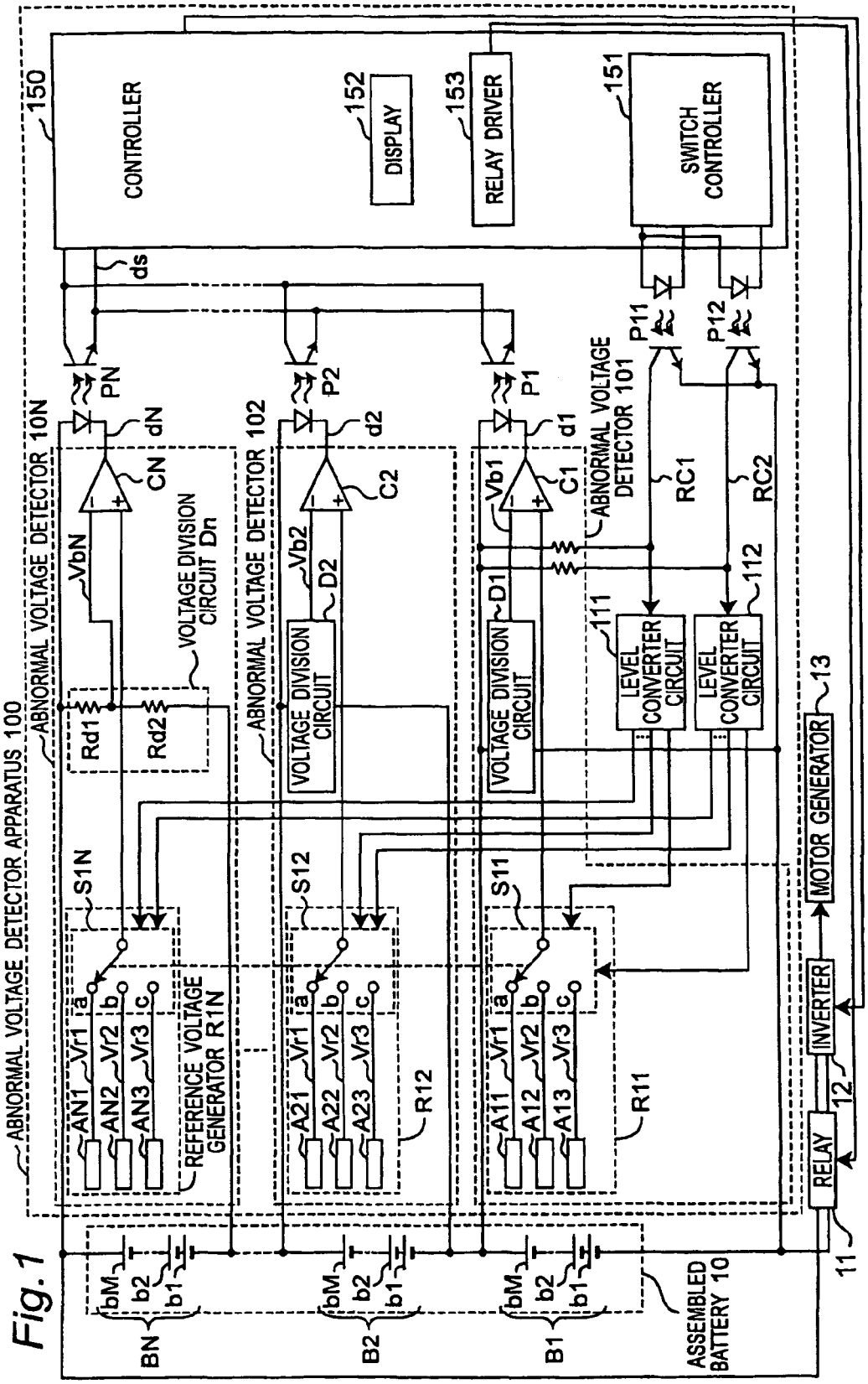
FIG. 1 is a block diagram showing a schematic configuration of an abnormal voltage detector apparatus for use in an assembled battery according to a first preferred embodiment of the present invention.

FIG. 1 is a block diagram showing a schematic configuration of the abnormal voltage detector apparatus 100 for use in the assembled battery according to a first preferred embodiment of the present invention. In FIG. 1, reference numeral 100 denotes an abnormal voltage detector apparatus, reference numeral 10 denotes an assembled battery, reference numeral 11 denotes a relay, reference numeral 12 denotes an inverter, and reference numeral 13 denotes a motor generator. The abnormal voltage detector apparatus 100, the assembled battery 10, the relay 11, the inverter 12, and the motor generator 13 are all installed in an electric vehicle. The DC power of the assembled battery 10 is converted into AC power by the inverter 12, and the AC power drives the motor generator 13, so that the electric vehicle runs. The relay 11 relays an electrical connection between the assembled battery 10 and the inverter 12.

The assembled battery 10 has such a configuration that "N" battery blocks B1 to BN (where "N" is a positive integer of two or more.) are connected in series to each other, for example, N=20 in FIG. 1. Furthermore, each of the battery blocks B1 to BN includes M secondary cells b1 to bM (where "M" is a positive integer of 2 or more.), which are connected in series to each other, for example, M=12 in FIG. 1. With this configuration, the assembled battery 10 becomes an assembled battery having 240 cells in total. In the first preferred embodiment, each of cells b1 to bM is a nickel-hydrogen battery having a nominal voltage of 1.2 V. Therefore, 14.4 V is obtained from each of battery blocks B1 to BN, and a total nominal voltage of 288 V is obtained from the assembled battery 10. In this description, the higher electric-potential side of the assembled battery 10 is referred to as a "high-order" and the lower electric-potential side thereof is referred to as a "low-order." Furthermore, the lowest-order battery block is designated by B1, and the highest-order battery block is designated by BN.

The abnormal voltage detector apparatus 100 includes abnormal voltage detectors 101 to 10N, level converter circuits 111 and 112, photo-couplers P1 to PN, P11 and P12 each having an input terminal pair and an output terminal pair which are electrically insulated from each other, and a controller 150.

The abnormal voltage detector 10N includes a reference voltage generator R1N, a voltage division circuit DN, and a comparator CN. The abnormal voltage detector 10N detects whether or not a voltage of the battery block BN is abnormal. In the first preferred embodiment, the abnormal voltage detector 10N detects such a state that the battery block BN is overcharged. The voltage division circuit DN is a series connection of a resistor Rd1 and a resistor Rd2. The voltage division circuit DN outputs a battery measuring voltage VbN, which is lowered from a voltage of the battery block BN by dividing a terminal voltage of the battery block BN, to an inverted input terminal of the comparator CN. In the first preferred embodiment, the voltage division circuit DN divides the terminal voltage of the battery block BN into a quarter thereof.

Figure 2:
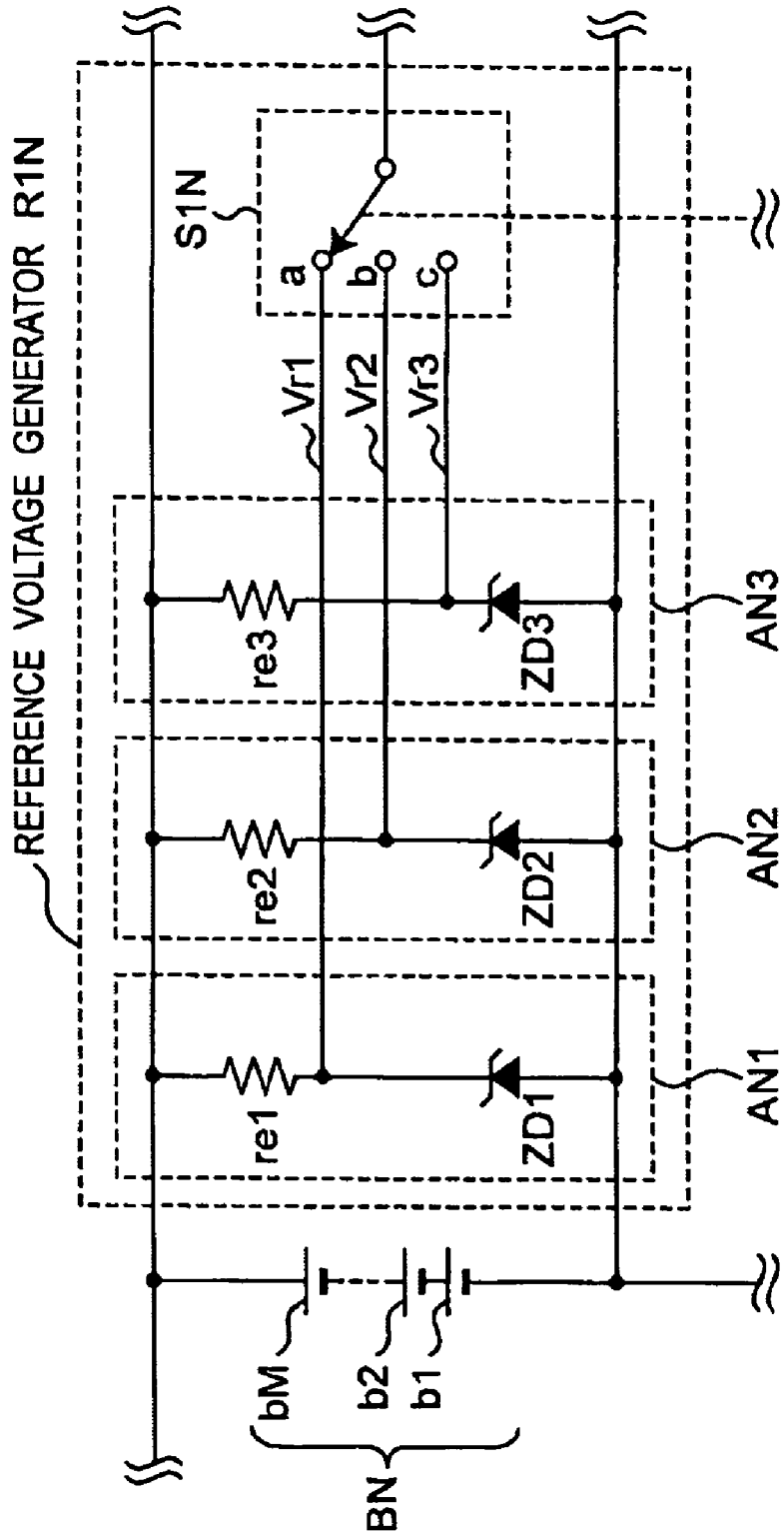
FIG. 2 is a circuit diagram showing a reference voltage generator R1N of the abnormal voltage detector apparatus for use in the assembled battery according to the first preferred embodiment of the present invention.

The reference voltage generator R1N includes reference voltage sources AN1, AN2 and AN3 and a switch S1N. FIG. 2 is a circuit diagram showing the reference voltage generator R1N. Each of the reference voltage sources AN1, AN2, and AN3 includes a Zener diode and a resistor (ZD1 and re1, ZD2 and re2, and ZD3 and re3). The Zener diodes ZD1, ZD2 and ZD3 have Zener voltages different from each other, respectively. In the first preferred embodiment, the reference voltage source AN1 generates a first reference voltage Vr1 for detecting that the voltage of the battery block BN is higher than a voltage of 18 V at which the battery block BN is slightly overcharged. The first reference voltage Vr1 is equal to the battery measuring voltage VbN as outputted from the voltage division circuit DN that inputs an output voltage of 18 V outputted from the battery block B1N. The reference voltage source AN2 generates a second reference voltage Vr2 for detecting that the voltage of the battery block BN is higher than a voltage of 20 V at which the battery block BN is greatly overcharged. The second reference voltage Vr2 is equal to the battery measuring voltage as VbN outputted from the voltage division circuit DN that inputs an output voltage of 20 V outputted from the battery block B1N. The reference voltage source AN3 generates a third reference voltage Vr3 for detecting that the voltage of the battery block BN is higher that a voltage of 22 V at which the battery block BN is so overcharged that such a failure occurs that the battery block BN is unrestored. The third reference voltage Vr3 is equal to the battery measuring voltage VbN outputted from the voltage division circuit DN that inputs an output voltage of 22 V as outputted from the battery block B1N. In the first preferred embodiment, it is set that Vr1<Vr2<Vr3.

The switch S1N is switched over in response to a two-bit control signal from the controller 150 to one of contacts "a" "b" and "c" thereof, and selectively inputs the reference voltage as outputted from one of the reference voltage sources AN1, AN2, and AN3 to a non-inverted input terminal of the comparator CN. The comparator CN of a differential circuit is driven by the voltage of the battery block BN. The battery measuring voltage VbN outputted from the voltage division circuit DN is applied to the inverted input terminal of the comparator CN. The comparator CN compares the battery measuring voltage VbN of the battery block BN with one of the reference voltages Vr1, Vr2 and Vr3, generates an abnormality detecting signal dN containing information about a detected result, and outputs it to the photo-coupler PN. An anode of an input light emitting diode (LED) of the photo-coupler PN is connected to a positive electrode of the battery block BN, and a cathode thereof is connected to an output terminal of the comparator CN.

The abnormal voltage detectors 101 to 10(N−1) have configurations similar to that of the abnormal voltage detector 10N. Reference voltage sources A11 to AN1 generate the first reference voltages Vr1 equal to output voltages Vb1 to VbN outputted from voltage division circuits D1 to DN that input the voltage of 18V as outputted from the battery blocks B1 to BN, respectively. Reference voltage sources A12 to AN2 generate the second reference voltages Vr2 equal to output voltages Vb1 to VbN outputted from the voltage division circuits D1 to DN that input the voltage of 20V as outputted from the battery blocks B1 to BN, respectively. Reference voltage sources A13 to AN3 generate the third reference voltages Vr3 equal to output voltages Vb1 to VbN outputted from the voltage division circuits D1 to DN that input the voltage of 22V as outputted from the battery blocks B1 to BN, respectively. The voltage division circuits D1 to DN are equal in the voltage division ratio. Comparators C1 to CN are driven by the voltages of the corresponding battery blocks B1 to BN, respectively. The reference voltage sources A11 to AN1, A12 to AN2, and A13 to AN3 and switches S11 to S1N are driven by the voltages of the corresponding battery blocks B1 to BN, respectively.

The switches S11 to S1N are switched over simultaneously in response to the two-bit control signal from the controller 150. The reference voltages Vr1, Vr2 or Vr3 is applied to each of non-inverted input terminals of the comparators C1 to CN at the same time. Each of the comparators C1 to CN generates the abnormality detecting signal having Low level, when the battery measuring voltage outputted from the corresponding voltage division circuit is higher than the reference voltage selected by the corresponding switch. On the other hand, each of the comparators C1 to CN generates the abnormality detecting signal having High level, in the reverse case thereof. The comparators C1 to CN output abnormality detecting signals d1 to dN to the photo-couplers P1 to PN, respectively.

Abnormality detecting signals d1 to dN outputted from the abnormal voltage detectors 101 to 10N which are output signals of the comparators C1 to CN are inputted to input LEDs of the photo-couplers P1 to PN, respectively. The photo-couplers P1 to PN transmit abnormality detecting signals d1 to dN in an electrically insulated state, respectively. In the first preferred embodiment, output photo-transistors of the photo-couplers P1 to PN constitute a wired-OR circuit, and are connected to the controller 150. The logical sum of the abnormality detecting signals d1 to dN is calculated. Namely, when the battery measuring voltage of at least one of battery blocks B1 to BN is higher than the reference voltage generated by the selected reference voltage, an output transistor of at least one of photo-couplers P1 to PN turns on.

The controller 150 includes a switch controller 151, a display 152, and a relay driver 153. The controller 150 inputs a logical sum signal ds, that is the logical sum of the abnormality detecting signals d1 to dN for the battery blocks B1 to BN. The logical sum signal ds is at High level in a normal state, and it is at Low level in a voltage abnormality state in which the battery measuring voltage of at least one of the battery blocks B1 to BN is higher than the reference voltage inputted to the non-inverted terminal of the corresponding comparator. The switch controller 151 transmits control signals RC1 and RC2 to the switches S1 to S1N, respectively, via the photo-couplers P11 and P12 and the level converter circuits 111 and 112. Each of the control signals RC1 and RC2 corresponds to each bit of the two-bit control signal for controlling operations of the switches that constitute the respective switches S11 to S1N. The display 152 displays a state of the assembled battery 10. The display 152 is, for example, an LED. The relay driver 153 drives the relay 11 to be opened or closed.

A hardware configuration (not shown) of the controller 150 will be described. The controller 150 includes a microcomputer, which includes a central processing unit (CPU), a memory, and an I/O port, and peripheral circuits. The controller 150 is driven by a low voltage power source (not shown). For example, the low voltage power source is a lead-acid battery having a nominal voltage of 12 V.

The switch controller 151 outputs control signals RC1 and RC2 to the photo-couplers P11 and P12, respectively, to drive input LEDs of the respective photo-couplers P11 and P12. The output phototransistors of the photo-couplers P11 and P12 transmit the control signals RC1 and RC2 to the level converter circuits 111 and 112, respectively. The level converter circuit 111 convert the voltage level of the control signal RC1 into converted voltage levels according to power source voltages of the N abnormal voltage detectors 101 to 10N, to generates the N control signals each having the converted voltage level, and output the N control signals to the abnormal voltage detectors 101 to 10N, respectively. The level converter circuit 112 convert the voltage level of the control signal RC2 into converted voltage levels according to power source voltages of the N abnormal voltage detectors 101 to 10N, to generates the N control signals each having the converted voltage level, and output the N control signals to the abnormal voltage detectors 101 to 10N, respectively. The level converter circuits 111 and 112 may be configured arbitrary.

Each of the abnormal voltage detectors 101 to 10N inputs two control signals each outputted from each of the level converter circuits 111 and 112, compares the battery measuring voltage of the corresponding battery block with the reference voltage selected by the two control signals, generates an abnormality detecting signal containing information about a detected result based on the result, and outputs it to the photo-coupler.

The controller 150 inputs the logical sum signal ds, that is a logical sum of the abnormality detecting signals d1 to dN via the I/O port. The logical sum signal ds is subjected to A/D conversion, i.e., it is converted into a digital signal at a predetermined sampling frequency. The CPU executes an abnormal voltage detection processing using digital data obtained as a result of the A/D conversion based on an abnormal voltage detection program (it will be described later) stored in a memory of the controller 150. The controller 150 outputs the control signals RC1 and RC2 for controlling operations of the switches that constitute the respective switches S11 to S1N and a control signal for controlling the relay 11 to be opened or closed, to the respective switches and relay 11 via the I/O port. The controller 150 is electrically insulated from the high voltage assembled battery 10 by the photo-couplers P1 to PN, P11, and P12. In actuality, the controller 150 often includes not only the abnormal voltage detection function for the assembled battery 10 but also a charge and discharge control function and a voltage measuring function of measuring the voltages of the battery blocks B1 to BN. In the first preferred embodiment, however, only the abnormal voltage detection function will be described.

Figure 3:
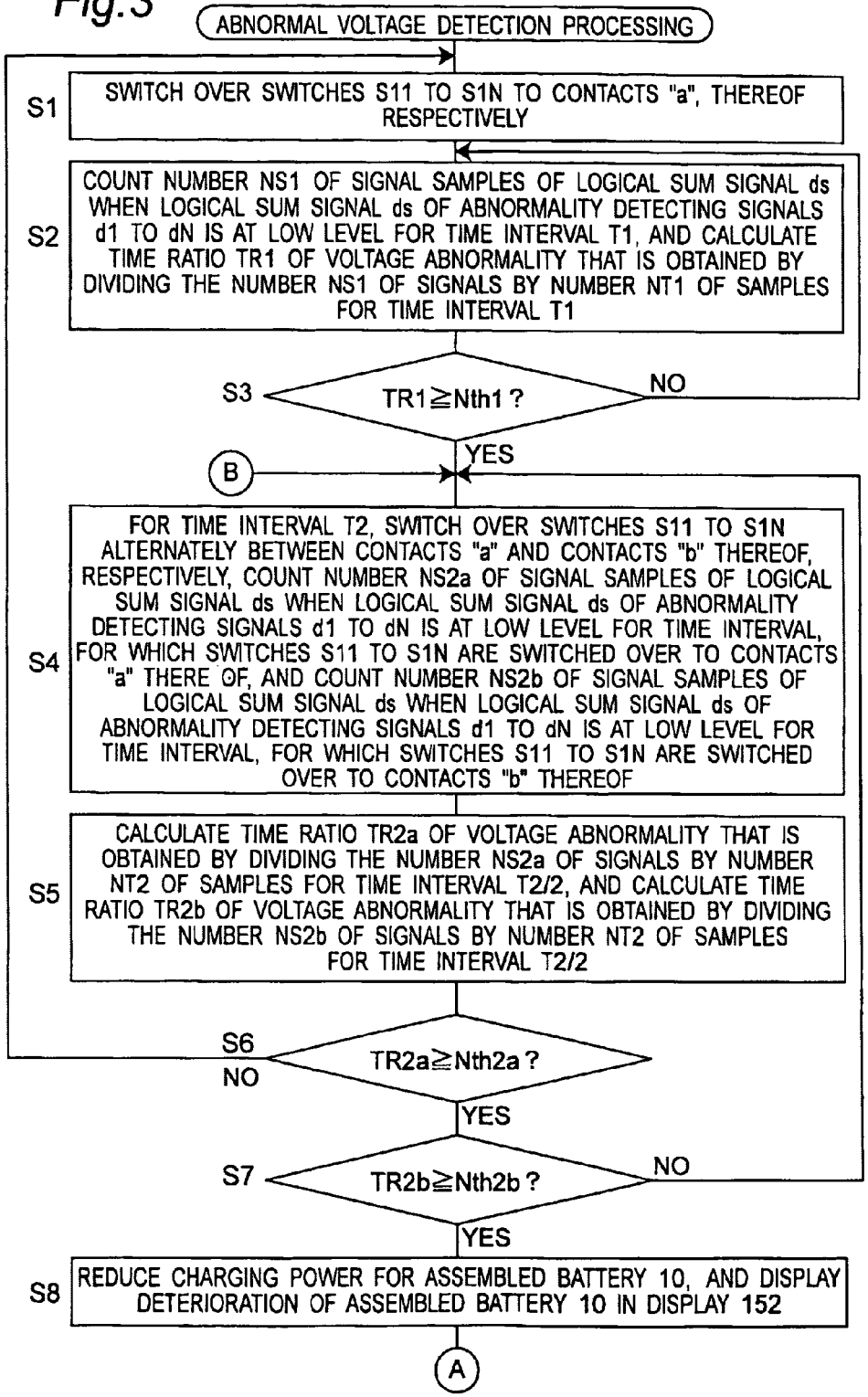
FIG. 3 is a flowchart showing a first part of an abnormal voltage detection processing executed by the abnormal voltage detector apparatuses for use in the assembled battery according to the first, second and third preferred embodiment of the present invention.
Figure 4:
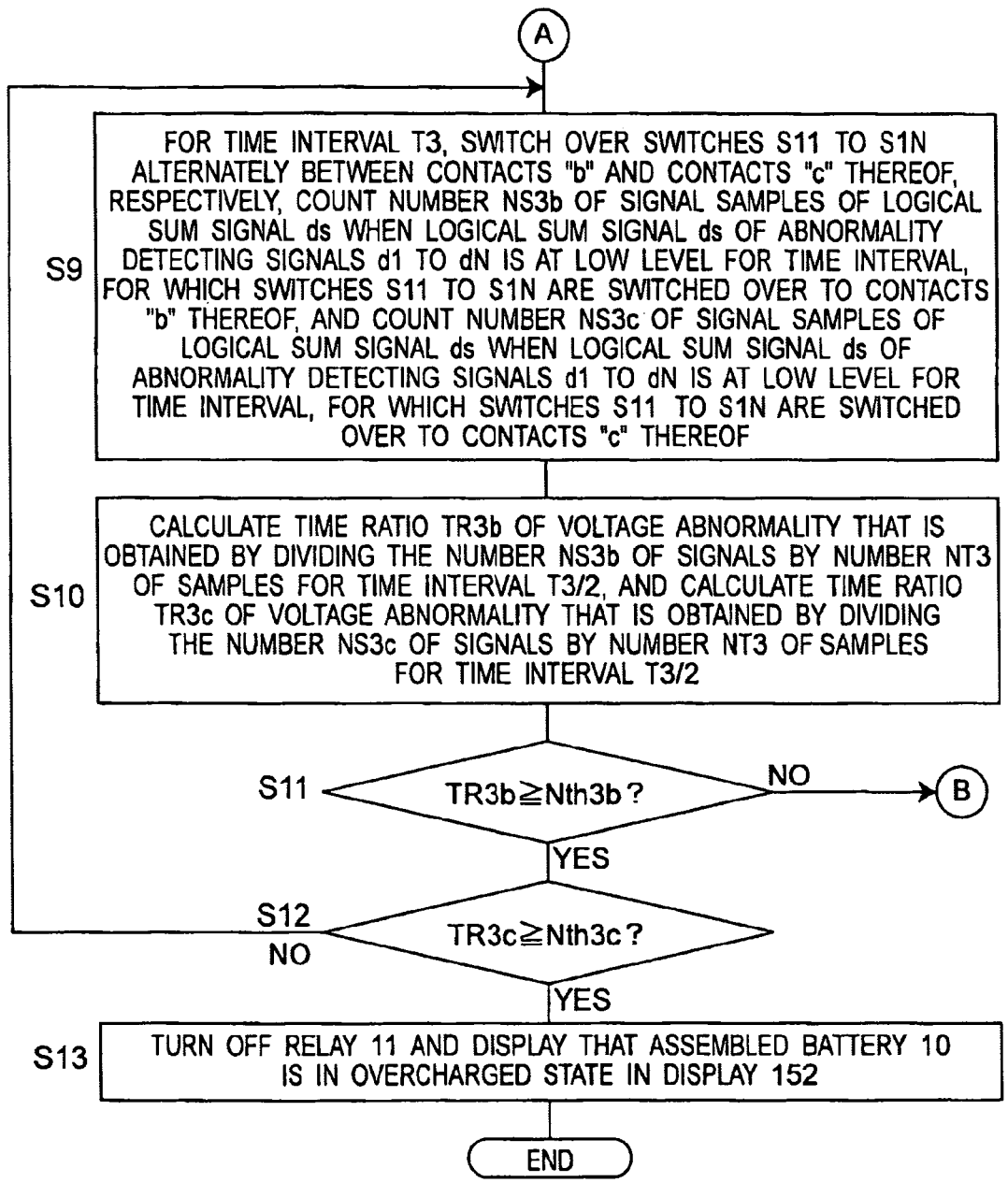
FIG. 4 is a flowchart showing a second part of the abnormal voltage detection processing executed by the abnormal voltage detector apparatuses for use in the assembled battery according to the first, second and third preferred embodiment of the present invention.
Figure 5:
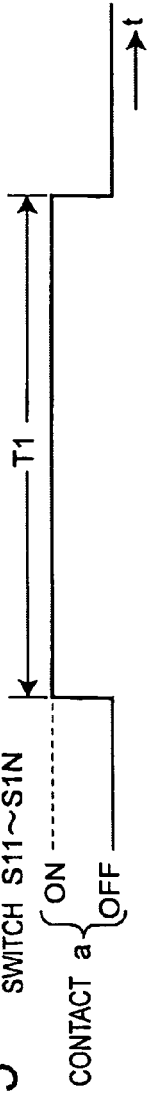
FIG. 5 is a timing chart showing an operation of switches S11 to S1N at step S1 of FIG. 3.
Figure 6:
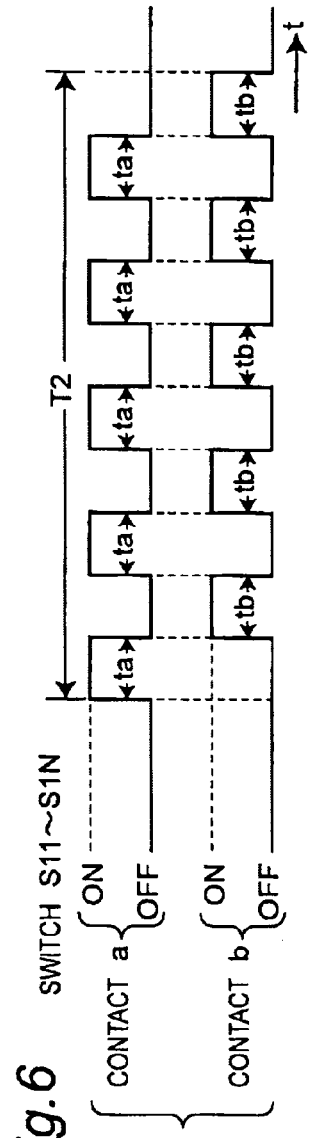
FIG. 6 is a timing chart showing an operation of switches S11 to S1N at step S4 of FIG. 3.
Figure 7:
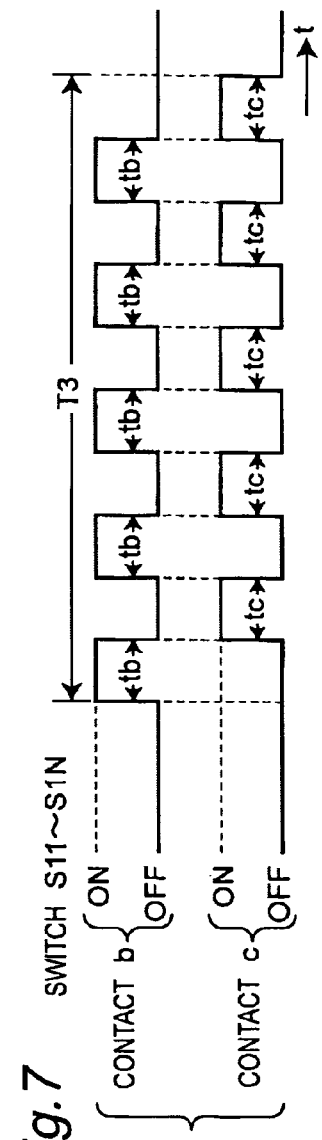
FIG. 7 is a timing chart showing an operation of switches S11 to S1N at step S9 of FIG. 4.

Referring to FIGS. 3 to 7, the abnormal voltage detection method will be described. FIGS. 3 and 4 are flowcharts showing an abnormal voltage detection processing executed by the abnormal voltage detector apparatus 100 for use in the assembled battery 10 according to the first preferred embodiment of the present invention. FIGS. 5, 6 and 7 are timing charts which show operations of switches S11 to S1N at step S1 of FIG. 3, step S4 of FIG. 3 and step S9 of FIG. 9, respectively. The processing shown in the flowcharts of FIGS. 3 and 4 is started when a driver turns on an ignition switch (not shown) of the electric vehicle to supply power to the controller 150 from the low voltage power source (not shown), the processing is always executed while the vehicle is moving, and ended when the driver turns off the ignition switch.

In step S1, the switch controller 151 generates the two-bit control signals RC1 and RC2 for switching over the switches S11 to S1N to the contacts "a" thereof, respectively. The switches S11 to S1N are switched over to the contacts "a" thereof, respectively, for a time interval T1 as shown in FIG. 5. The first reference voltage Vr1 is applied to the non-inverted input terminal of each of the comparators C1 to CN. The controller 150 inputs the logical sum signal ds, that is the logical sum of the abnormality detecting signals d1 to dN, and converts the signal ds into a digital signal at a predetermined sampling frequency. In step S2, the controller 150 counts a number NS1 of signal samples of the logical sum signal ds when the logical sum signal of the abnormality detecting signals d1 to dN is at Low level for the time interval T1, and calculate a time ratio TR1 of voltage abnormality that is obtained by dividing the number NS1 of signals by a number NT1 of samples for the time interval T1. If the sampling frequency of the logical sum signal ds is set to be sufficiently high, the time ratio TR1 becomes substantially the same as a ratio of a voltage abnormality time interval to the time interval T1, for which the voltage abnormality time interval defined as such a time when the assembled battery 10 is in a voltage abnormality state that the battery measuring voltage of at least one of the battery blocks B1 to BN is higher than the first reference voltage Vr1. If the sampling frequency of the logical sum signal ds is set to be low, the time ratio TR1 almost equivalent to the ratio of the voltage abnormality time interval to the time interval T1 can be detected with lower accuracy. In step S3, the controller 150 determines whether or not the assembled battery 10 is in the voltage abnormality state by judging whether or not the time ratio TR1 is equal to or greater than a predetermined threshold value Nth1. If the time ratio TR1 is smaller than the threshold value Nth1, the processing of step S2 is repeatedly executed. If the time ratio TR1 is equal to or greater than the threshold value Nth1, the processing flow goes to step S4. In the first preferred embodiment, T1 and Nth1 are preferably set to 1.0 second and 0.8, respectively.

In step S4, the switch controller 151 generates the control signals RC1 and RC2 for switching over the switches S11 to S1N alternately between contacts "a" and "b" thereof, respectively, for a time interval T2. The switches S11 to S1N repeat alternately switching over to the contacts "a" thereof for a time interval "ta" and switching over to the contacts "b" thereof for a time interval "tb", respectively, as shown in FIG. 6. The first reference voltage Vr1 and the second reference voltage Vr2 are applied alternately to the non-inverted input terminal of each of the comparators C1 to CN for the time intervals "ta" and "tb", respectively. In the first preferred embodiment, T2, "ta" and "tb" are preferably set to 2.0 seconds, 0.2 seconds and 0.2 seconds, respectively. The controller 150 counts a number NS2a of signal samples of the logical sum signal ds when the logical sum signal ds of abnormality detecting signals d1 to dN is at Low level for the time interval, for which the switches S11 to S1N are switched over to the contacts "a" thereof, and counts a number NS2b of signal samples of the logical sum signal ds when the logical sum signal ds of abnormality detecting signals d1 to dN is at Low level for the time interval, for which the switches S11 to S1N are switched over to the contacts "b" thereof. In step S5, the controller 150 calculates a time ratio TR2*a* of a voltage abnormality that is obtained by dividing the number NS2*a* of signals by a number NT2 of samples for the time interval T2/2, and calculates a time ratio TR2*b* of a voltage abnormality that is obtained by dividing the number NS2*b* of signals by the number NT2 of samples for the time interval T2/2. If the sampling frequency of the logical sum signal ds is set to be sufficiently high, the time ratio TR2A becomes substantially the same as a ratio of a voltage abnormality time interval to the time interval T2/2, for which the voltage abnormality time interval is defined as such a time when the assembled battery 10 is in a voltage abnormality state that the battery measuring voltage of at least one of the battery blocks B1 to BN is higher than the first reference voltage Vr1. If the sampling frequency of the logical sum signal ds is set to be sufficiently high, the time ratios TR2*a* and TR2*b* become substantially the same as ratios of a voltage abnormality time interval to the time interval T2/2, for which the voltage abnormality time interval is defined as such a time when the assembled battery 10 is in a voltage abnormality state that the battery measuring voltage of at least one of the battery blocks B1 to BN is higher than the reference voltages Vr1 and Vr2, respectively. If the sampling frequency of the logical sum signal ds is set to be low, the time ratios TR2*a* and TR2*b* almost equivalent to each of the ratios of the voltage abnormality time interval to the time interval T2/2 can be detected with lower accuracy. In step S6, the controller determines whether or not the time ration TR2*a* is equal to or greater than a predetermined threshold value Nth2*a*. If the time ratio TR2*a* is smaller than the threshold value Nth2*a*, the processing flow goes back to step S1. If the time ratio TR2*a* is equal to or greater than the threshold value Nth2*a*, the processing flow goes to step S7. In step S7, the controller determines whether or not the time ration TR2*b* is equal to or greater than a predetermined threshold value Nth2*b*. If the time ratio TR2*b* is smaller than the threshold value Nth2*b*, the processing flow goes back to step S4. If the time ratio TR2*b* is equal to or greater than the threshold value Nth2*b*, the processing flow goes to step S8. In the first preferred embodiment, T2, Nth2*a*, and Nth2*b* are preferably set to 1.2 second, 0.8 and 0.8, respectively. In steps S6 and S7, when the controller 150 detects the voltage abnormality of the assembled battery 10 by comparing each of battery measuring voltages Vb1 to VbN with the first reference voltage Vr1, the controller 150 detects the voltage abnormality of the assembled battery 10 by comparing each of the battery measuring voltages Vb1 to VbN with the second reference voltage Vr2, which is higher than the first reference voltage Vr1.

In step S8, the controller 150 controls the inverter 12 to reduce charging power for the assembled battery 10. For example, the controller 150 controls a regeneration break at breaking and speed reduction, by which the motor generator 13 operates as a generator, or controls the inverter 12 so that the motor generator 13 operates as a motor and consumes the electric power of the assembled battery 10. Further, the display 152 turns on, for example, a yellow lamp to display that the battery is greatly overcharged. Then the processing flow goes to step S9 of FIG. 4.

In step S9, the switch controller 151 generates the control signals RC1 and RC2 for switching over the switches S11 to S1N alternately between contacts "b" and "c" thereof, respectively, for a time interval T3. The switches S11 to S1N repeat alternately switching over to the contacts "b" thereof for a time interval "tb" and switching over to the contacts "c" thereof for a time interval "tc", respectively, as shown in FIG. 7. The second reference voltage Vr2 and the third reference voltage Vr3 are applied alternately to the non-inverted input terminal of each of the comparators C1 to CN for the time intervals "tb" and "tc", respectively. In the first preferred embodiment, T3, tb and tc are preferably set to 2.0 seconds, 0.2 seconds and 0.2 seconds, respectively. The controller 150 counts a number NS3*b* of signal samples of the logical sum signal ds when the logical sum signal ds of abnormality detecting signals d1 to dN is at Low level for the time interval, for which the switches S11 to S1N are switched over to the contacts "b" thereof, and counts a number NS3*c* of signal samples of the logical sum signal ds when the logical sum signal ds of abnormality detecting signals d1 to dN is at Low level for the time interval, for which the switches S1 to S1N are switched over to the contacts "c" thereof. In step S10, the controller 150 calculates a time ratio TR3*b* of a voltage abnormality that is obtained by dividing the number NS3*b* of signals by a number NT3 of samples for the time interval T3/2, and calculates a time ratio TR3*c* of a voltage abnormality that is obtained by dividing the number NS3*c* of signals by the number NT3 of samples for the time interval T3/2. If the sampling frequency of the logical sum signal ds is set to be sufficiently high, the time ratios TR3B and TR3*c* become substantially the same as ratios of a voltage abnormality time interval to the time interval T3/2, for which the voltage abnormality time interval is defined as such a time when the assembled battery 10 is in a voltage abnormality state that the battery measuring voltage of at least one of the battery blocks B1 to BN is higher than the reference voltages Vr2 and Vr3, respectively. If the sampling frequency of the logical sum signal ds is set to be low, the time ratios TR3*b* and TR3*c* almost equivalent to each of the ratios of the voltage abnormality time interval to the time interval T3/2 can be detected with lower accuracy. In step S11, the controller 150 determines whether or not the time ration TR3*b* is equal to or greater than a predetermined threshold value Nth3*b*. If the time ratio TR3*b* is smaller than the threshold value Nth3*b*, the processing flow goes back to step S4. If the time ratio TR3*b* is equal to or greater than the threshold value Nth3*b*, the processing flow goes to step S12. In step S12, the controller determines whether or not the time ration TR3*c* is equal to or greater than a predetermined threshold value Nth3*c*. If the time ratio TR3*c* is smaller than the threshold value Nth3*c*, the processing flow goes back to step S9. If the time ratio TR3*c* is equal to or greater than the threshold value Nth3*c*, the processing flow goes to step S13. In the first preferred embodiment, T3, Nth3*b*, and Nth3*c* are preferably set to 1.2 seconds, 0.8 and 0.8, respectively. In steps S11 and S12, when the controller 150 detects the voltage abnormality of the assembled battery 10 by comparing each of battery measuring voltages Vb1 to VbN with the second reference voltage Vr2, the controller 150 detects the voltage abnormality of the assembled battery 10 by comparing each of the battery measuring voltages Vb1 to VbN with the third reference voltage Vr3, which is higher than the second reference voltage Vr2.

If the voltage abnormality is detected at the third reference voltage Vr3, this indicates that one of the battery blocks B1 to BN that constitute the assembled battery 10 is so overcharged that such a failure occurs that the battery block and that the battery block is unrestored. In step S13, the relay driver 153 turns off the relay 11 to stop supplying the power to the motor generator 13 from the assembled battery 10. In addition, the display 152 turns on, for example, a red lamp to display that the assembled battery 10 is in an overcharged state.

The abnormal voltage detector apparatus 100 for use in the assembled battery 10 according to the first preferred embodiment compares the battery measuring voltage Vb1 to VbN, each of which is lowered from the voltage of the battery block by dividing the terminal voltage of the battery block, with the three reference voltages Vr1, Vr2, and Vr3, respectively, detects whether or not each of battery blocks B1 to BN is in a voltage abnormality state, and generates the abnormality detecting signals d1 to dN each of which contains information about a detected result. Then, upon detecting the voltage abnormality by using each of the reference voltages Vr1, Vr2, and Vr3, the abnormal voltage detector apparatus 100 calculates the time ratio of a time interval, for which the assembled battery 10 is in the voltage abnormality state, to a predetermined time interval based on the logical sum signal ds of the abnormality detecting signals d1 to dN, and detects the voltage abnormality of the assembled battery 10 based on the time ratio. The display 152 displays the states of the assembled battery 10 to the user upon using respective reference voltage. The abnormal voltage detector apparatus 100 changes the reference voltage to stepwise detect the voltage abnormality of the assembled battery 10. Accordingly, the accuracy of detecting the voltage abnormality can be increased. Alternatively, the abnormal voltage detector apparatus may include four reference voltages. The abnormal voltage detector apparatus 100 automatically sets an appropriate reference voltage according to a present state of each battery block, and promptly detects a change in the state of the battery block. The abnormal voltage detector apparatus 100 has such an advantageous effect as preventing the battery blocks from being overcharged.

FIG. 8 is a timing chart showing another operation of switches S11 to S1N at step S4 of FIG. 3. In step S4, the switches S11 to S1N may be switched over to the contacts "a" thereof for a time interval "taa", and then switched over to the contacts "b" thereof for a time interval "tba" (=T2−taa). For example, "taa" and "tba" are set to 0.6 seconds.

FIG. 9 is a timing chart showing another operation of switches S11 to S1N at step S9 of FIG. 4. In step S9, the switches S11 to S1N may be switched over to the contacts "b" thereof for a time interval "tbb", and then switched over to the contacts "c" thereof for a time interval "tcb" (=T3−tbb). For example, "tbb" and "tcb" are set to 0.6 seconds.

Figure 10:
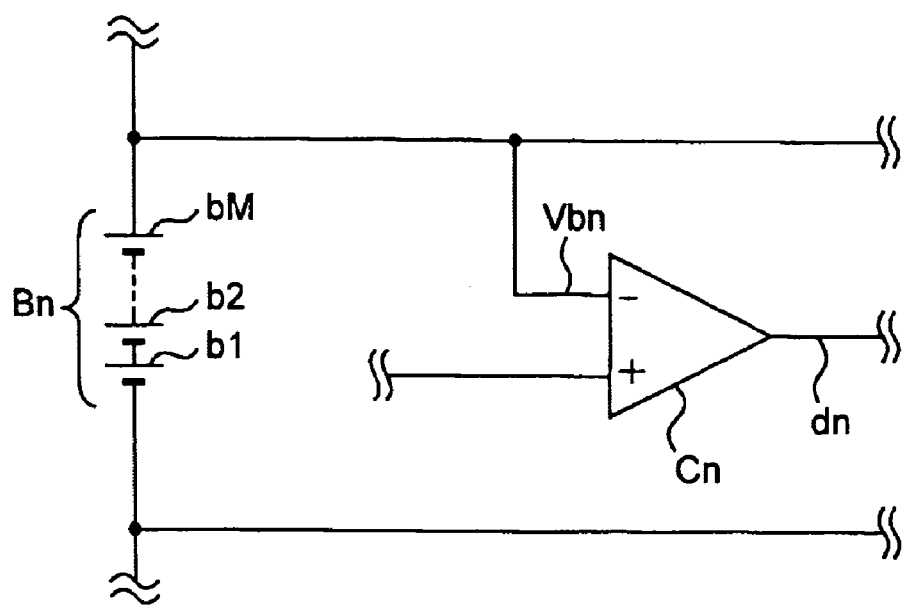
FIG. 10 is a circuit diagram showing a part of an abnormal voltage detector apparatus for use in the assembled battery according to a modified preferred embodiment of the first preferred embodiment of the present invention.

In the abnormal voltage detectors 101 to 10N of the first preferred embodiment, the voltage division circuits D1 to DN output the battery measuring voltage Vb11 to VbN each of which is lowered from a voltage of the corresponding battery block by dividing a terminal voltage of the battery block, to the inverted input terminals of the comparators C1 to CN, respectively. FIG. 10 is a circuit diagram showing a part of an abnormal voltage detector apparatus for use in the assembled battery according to a modified preferred embodiment of the first preferred embodiment of the present invention. Positive terminals of the battery blocks B1 to BN may be connected directly to the inverted input terminals of the comparators C1 to CN, respectively, as shown in FIG. 10. In this case, the battery measuring voltage Vb1 to VbN are set to the positive terminal voltages of the battery blocks B1 to BN, respectively.

The abnormal voltage detector apparatus 100 counts the number of signal samples of the logical sum signal ds when the logical sum signal ds is at Low level, for the predetermined time interval, and calculates the time ratio of voltage abnormality that is obtained by dividing the number of signals by the number of samples for the time interval (at steps S2, S4, S5 and S9 of FIG. 3 and step S10 of FIG. 4). In the first preferred embodiment, "the voltage abnormality state" is such a state that the battery measuring voltage of at least one of the battery blocks B1 to BN is higher than the reference voltage that is selected by the switches S11 to S1N from the reference voltages Vr1, Vr2 and Vr3. The abnormal voltage detector apparatus 100 may count the number of signal samples of the logical sum signal ds when the logical sum signal ds is at Low level, for the predetermined time interval, may compare the number of signals with the threshold value of the number of signals, and may decide whether or not the assembled battery 10 is in the voltage abnormality state. The abnormal voltage detector apparatus 100 may detect a time interval for which the logical sum signal ds is at Low level, for the predetermined time interval, may compare the time interval with the threshold value of the time interval, and may decide whether or not the assembled battery 10 is in the voltage abnormality state.

Second Preferred Embodiment

Figure 11:
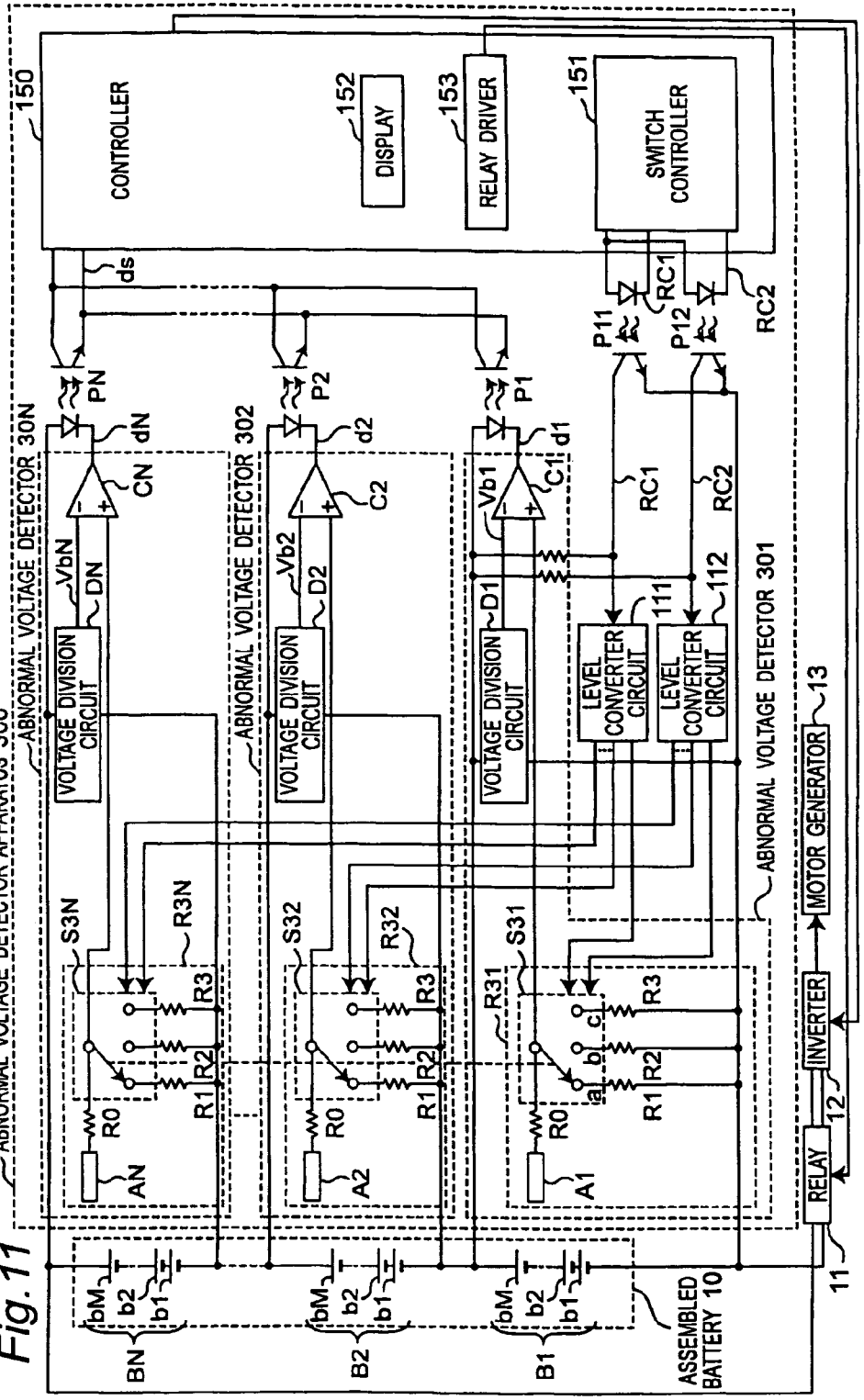
FIG. 11 is a block diagram showing a schematic configuration of an abnormal voltage detector apparatus for use in the assembled battery according to a second preferred embodiment of the present invention.

Referring to FIGS. 3 to 7, and FIG. 11, an abnormal voltage detector apparatus 300 according to a second preferred embodiment of the present invention will be described. FIG. 11 is a block diagram showing a schematic configuration of the abnormal voltage detector apparatus 300 for use in the assembled battery 10 according to the second preferred embodiment of the present invention. In FIG. 11, components common to those shown in FIG. 1 are designated by common numerals, and their descriptions are omitted. Each of the reference voltage generators R11 to R1N of the abnormal voltage detector apparatus 100 according to the first preferred embodiment includes the three reference voltage sources to generate the first, the second, and the third reference. According to a second preferred embodiment, another configuration of each abnormal voltage detector for generating the first, the second, and the third reference voltages will be shown.

In FIG. 11, reference numeral 300 denotes the abnormal voltage detector apparatus, 10 denotes the assembled battery, 11 denotes the relay, 12 denotes the inverter, and 13 denotes the motor generator. The abnormal voltage detector apparatus 300, the assembled battery 10, the relay 11, the inverter 12, and the motor 13 are all installed in an electric vehicle. The DC power of the assembled battery 10 is converted into AC power by the inverter 12, and the AC power drives the motor generator 13, so that the electric vehicle runs.

The abnormal voltage detector apparatus 300 includes abnormal voltage detectors 301 to 30N, level converter circuits 111 and 112, photo-couplers P1 to PN, P11, and P12, and the controller 150. The abnormal voltage detector apparatus 300 according to the second preferred embodiment has such a configuration that the abnormal voltage detectors 101 to 10N are replaced with the abnormal voltage detectors 301 to 30N, respectively.

The abnormal voltage detector 301 includes a reference voltage generator R31, the voltage division circuit D1, and the comparator C1, and detects a voltage abnormality of the battery block B1. In the second preferred embodiment, the abnormal voltage detector 301 detects an overcharged state of the battery block B1. The abnormal voltage detector 301 differs from the abnormal voltage detector 101 according to the first preferred embodiment of FIG. 1 only by using the method for generating a reference voltage applied to the non-inverted input terminal of the comparator C1. The reference voltage generator R31 includes a reference voltage source A1, resistors R0, R1, R2, and R3. The reference voltage source A1 includes a Zener diode and a resistor, in a manner similar to those of the reference voltage sources A11 to AN1, A12 to AN2, and A13 to AN3 (See FIG. 2). One end of the resistor R0 is connected to an output terminal of the reference voltage source A1, and the other end thereof is connected to the switch S31. One end of the each of resistors R1, R2 and R3 is connected to a negative electrode of the battery block B1, respectively, and the other end thereof is connected to the contacts "a", "b" and "c" of the switch S31, respectively. A voltage generated by the reference voltage source A1 is divided by a resistance value of the resistors R0 and any one of resistance values of the resistors R1, R2 and R3 selected by the switch S31, and a divided voltage is applied to the non-inverted input terminal of the comparator C1. In the second preferred embodiment, resistance values of the resistors R1, R2 and R3 are set to satisfy R1<R2<R3.

In the second preferred embodiment, if the switch S31 is switched over to the contact "a" thereof, a first reference voltage Vr1 equal to an output voltage Vb1 outputted from the voltage division circuit D1 that inputs a voltage of 18 V at which the battery block B1 is slightly overcharged is inputted to the non-inverted input terminal of the comparator C1. If the switch S31 is switched over to the contact "b" thereof, a second reference voltage Vr2 equal to an output voltage Vb1 outputted from the voltage division circuit D1 that inputs a voltage of 20 V at which the battery block B1 is greatly overcharged is inputted to the non-inverted input terminal of the comparator C1. If the switch S31 switched over to the contact "c" thereof, a third reference voltage Vr3 equal to an output voltage Vb3 outputted from the voltage division circuit D1 that inputs a voltage of 22 V at which the battery block B1 is so overcharged that a failure occurs and that the battery block B1 is unrestored is inputted to the non-inverted input terminal of the comparator C1.

The abnormal voltage detectors 302 to 30N have configurations configuration similar to that of the abnormal voltage detector 301. The abnormal voltage detectors 302 to 30N divide voltages generated by reference voltage sources A2 to An by the resistance value of the resistor R0 and any one of resistance values of the resistors R1, R2 and R3, and apply divided voltages to non-inverted input terminals of comparators C2 to CN, respectively. In each of the abnormal voltage detectors 302 to 30N, each of switches S32 to S3N selects one of the resistors R1, R2 and R3. The switches S31 to S3N operates simultaneously. The reference voltage sources A1 to AN are driven by voltages of the corresponding battery blocks B1 to BN, respectively.

The switch controller 151 of the controller 150 transmits control signals RC1 and RC2 to the switches S31 to S3N, respectively, via the photo-couplers P11 and P12 and the level converter circuits 111 and 112. The abnormal voltage detector apparatus 300 detects the voltage abnormality of the assembled battery 10 with switching the reference voltage among the first reference voltage, the second reference voltage, and the third reference voltage in a manner similar to that of the voltage abnormality detector apparatus 100 according to the first preferred embodiment (See FIGS. 3 to 7).

The abnormal voltage detector apparatus 300 according to the second preferred embodiment exhibits advantageous effects similar to those of the abnormal voltage detector apparatus 100 according to the first preferred embodiment. Further, since each of the abnormal voltage detectors 301 to 30N includes only one reference voltage source, the abnormal voltage detector apparatus 300 can be realized at lower cost than that of the abnormal voltage detector apparatus 100 according to the first preferred embodiment.

Third Preferred Embodiment

Figure 12:
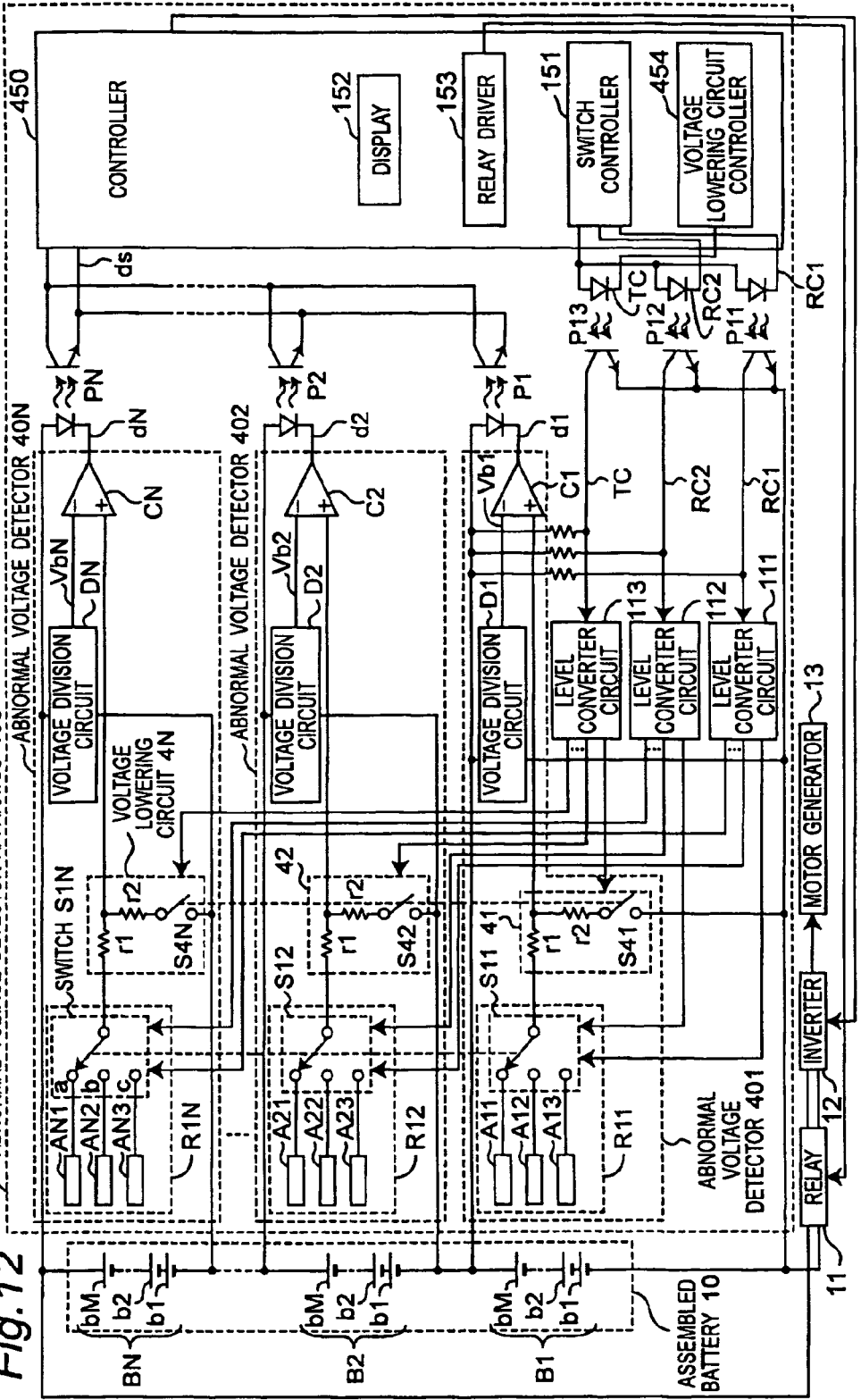
FIG. 12 is a block diagram showing a schematic configuration of an abnormal voltage detector apparatus for use in the assembled battery according to a third preferred embodiment of the present invention.

Referring to FIGS. 3 to 7 and FIG. 12, an abnormal voltage detector apparatus 400 according to a third preferred embodiment of the present invention will be described. FIG. 12 is a block diagram showing a schematic configuration of the abnormal voltage detector apparatus 400 for use in the assembled battery 10 according to the third preferred embodiment of the present invention. In FIG. 12, components common to those shown in FIG. 1 are designated by common numerals, and their descriptions are omitted. The abnormal voltage detector apparatus 400 has such a configuration that the abnormal voltage detector apparatus 100 according to the first preferred embodiment has an additional function of detecting whether or not an abnormal voltage detection function operates normally (also referred to as "a function of checking the abnormality detecting function").

In FIG. 4, reference numeral 400 denotes the abnormal voltage detector apparatus, reference numeral 10 denotes the assembled battery, reference numeral 11 denotes the relay, reference numeral 12 denotes the inverter, and reference numeral 13 denotes the motor generator. The abnormal voltage detector apparatus 400, the assembled battery 10, the relay 11, the inverter 12, and the motor 13 are all installed in an electric vehicle. The DC power of the assembled battery 10 is converted into AC power by the inverter 12, and the AC power drives the motor generator 13, so that the electric vehicle runs.

The abnormal voltage detector apparatus 400 includes abnormal voltage detectors 401 to 40N, level converter circuits 111, 112 and 113, photo-couplers P1 to PN, P11, P12 and P13, and a controller 450. The abnormal voltage detector apparatus 400 according to the third preferred embodiment has such a configuration that the abnormal voltage detectors 101 to 10N and the controller 150 of the abnormal voltage detector apparatus 100 of FIG. 1 are replaced with abnormal voltage detectors 401 to 40N and a controller 450, respectively, and the level converter circuit 113 and the photo-coupler P13 having an input terminal pair and an output terminal pair which are electrically insulated from each other, are additionally provided in the abnormal voltage detector apparatus 100.

The abnormal voltage detector 401 has such a configuration that a voltage lowering circuit 41 is additionally provided in the abnormal voltage detector 101 of the abnormal voltage detector apparatus 100. The voltage lowering circuit 41 includes resistors r1 and r2, and a switch S41. One end of a series connection circuit of the resistor r2 and the switch S41 is connected to a negative electrode of a battery block B1, and the other end thereof is connected to a non-inverted input terminal of a comparator C1. The resistor r1 is connected between a switch S11 and a common connection point common to the series connection of the resistor r2 and the switch S41 and to the non-inverted input terminal of the comparator C1. If the switch S41 is open, the abnormal voltage detector 401 operates in a manner similar to that of the abnormal voltage detector 101. If the switch S41 is closed, one of the first reference voltage Vr1, the second reference voltage Vr2, and the third reference voltage Vr3 selected by the switch S11 is divided and lowered by resistance values of the resistors r1 and r2, and a divided voltage is applied to the non-inverted input terminal of the comparator C1.

Abnormal voltage detectors 402 to 40N have such configurations that voltage lowering circuits 42 to 4N are additionally provided in the abnormal voltage detector 102 to 10N, respectively. Each of the voltage lowering circuits 42 to 4N includes resistors r1 and r2 and each of switches S42 to S4N, in a manner similar to that of the voltage lowering circuit 41.

The controller 450 has such a configuration that a voltage lowering circuit controller 454 is additionally provided in the controller 150. The voltage lowering circuit controller 454

The voltage lowering circuit controller 454 transmits the voltage lowering circuit driving signal TC to the level converter circuit 113 via the photo-coupler P13. The level converter circuit 113 convert the voltage level of the control signal TC into converted voltage levels according to power source voltages of the N voltage lowering circuits 42 to 4N, to generates the N control signals each having the converted voltage level, and output the N control signals to the voltage lowering circuits 41 to 4N, respectively. The switches S41 to S4N operates simultaneously.

The controller 450 tests or checks whether or not the abnormal voltage detectors 401 to 40N operate normally when a driver switches an ignition switch (not shown) of the electric vehicle from turning OFF to ON and a low voltage power source (not shown) starts supplying power to the controller 450. If the abnormal voltage detectors 401 to 40N operate normally, the processing of the flowchart of FIGS. 3 and 4 is executed so as to execute an ordinary abnormal voltage detection processing. FIGS. 3 and 4 are flowcharts showing an abnormal voltage detection processing executed by the abnormal voltage detector apparatus 400 for use in the assembled battery 10 according to the third preferred embodiment of the present invention. The flowcharts of FIGS. 3 and 4 are already described above. During the ordinary abnormal voltage detection process, the switches S41 to S4N of the voltage lowering circuits 41 to 4N are all turned OFF.

The abnormal voltage detector apparatus 400 according to the third preferred embodiment changes the reference voltages Vr1, Vr2 and Vr3 relative to each of the battery measuring voltages Vb1 to VbN of each battery block by the voltage lowering circuits 41 to 4N, and generates each of the abnormality detecting signals d1 to dN by comparing each of battery measuring voltages Vb1 to VbN with the reference voltages Vr1, Vr2 and Vr3. The controller 450 detects whether or not the abnormal voltage detector apparatus operates normally based on the logical sum signal ds of the abnormality detecting signals d1 to dN.

A method for detecting whether or not the abnormal voltage detector apparatus 400 operates normally will be described. It is noted that the test of the abnormal voltage detection function is conducted while all the battery blocks B1 to BN are not overcharged yet (e.g., before charging or before the electric vehicle moves).

First of all, in the first test processing, the switches S41 to S4N of the abnormal voltage detectors 401 to 40N are opened and the switches S11 to S1N are switched over to the contact "a" thereof, respectively. The first reference voltages Vr1 generated by the reference voltage sources A11 to AN1 are applied to the non-inverted input terminals of the comparators C1 to CN without processing them, respectively. If the output voltages of the battery blocks B1 to BN are in a normal state and the reference voltage sources A11 to AN1, the voltage division circuits D1 to DN, and the comparators C1 to CN are in a normal state, the logical sum signal ds is at High level.

Next, in the second test processing, with the switches S41 to S4N kept open, the switches S11 to S1N are switched over to the contact "b" thereof, respectively. If the output voltages of the battery blocks B1 to BN are in a normal state and the reference voltage sources A12 to AN2, the voltage division circuits D1 to DN, and the comparators C1 to CN are in a normal state, the logical sum signal ds is at High level.

Next, in the third test processing, with the switches S41 to S4N kept open, the switches S11 to S1N are switched over to the contact "c" thereof, respectively. If the output voltages of the battery blocks B1 to BN are in a normal state and the reference voltage sources A13 to AN3, the voltage division circuits D1 to DN, and the comparators C1 to CN are in a normal state, the logical sum signal ds is at High level.

Next, in the fourth test processing, the switches S41 to S4N are closed, and the switches S11 to S1N are switched over to the contacts "a" thereof. The first reference voltages Vr1 generated by the reference voltage sources A11 to AN1 are divided by the resistance values of the resistors r1 and r2, respectively. The divided voltages are applied to the non-inverted input terminals of the comparators C1 to CN, respectively. The resistance values of the resistors r1 and r2 are set so that the voltage applied to the non-inverted input terminal of the comparators C1 to CN are sufficiently lower than the voltages applied to the inverted input terminals of the comparators C1 to CN. Accordingly, if the reference voltage sources A11 to AN1, the voltage division circuits D1 to DN, and the comparators C1 to CN are in a normal state, the logical sum signal ds is at Low level.

Next, in the fifth test processing, with the switches S41 to S4N kept closed, the switches S11 to S1N are switched over to the contacts "b" thereof. If the reference voltage sources A12 to AN2, the voltage division circuits D1 to DN, and the comparators C1 to CN are in a normal state, the logical sum signal ds is at Low level.

Next, in the sixth test processing, with the switches S41 to S4N kept closed, the switches S11 to S1N are switched over to the contacts "c" thereof. If the reference voltage sources A13 to AN3, the voltage division circuits D1 to DN, and the comparators C1 to CN are in a normal state, the logical sum signal ds is at Low level.

The controller 450 controls the operations of the switches S11 to S1N, and S41 to S4N as the first to the sixth test processings. The controller 450 decides that the abnormal voltage detectors 401 to 40N operate normally, in the case that the levels of the logical sum signal ds in the above-mentioned test processings are at the same levels as the above-mentioned levels, and decides that at least one of the abnormal voltage detectors 401 to 40N is broken in other cases. The controller 450 controls a display 152 to display test results of the abnormal voltage detection functions of the abnormal voltage detectors 401 to 40N by, for example, turning on a lamp.

The abnormal voltage detector apparatus 400 according to the third preferred embodiment exhibits advantageous effects similar to those of the abnormal voltage detector apparatus 100 according to the first preferred embodiment. Further, the abnormal voltage detector apparatus 400 exhibits such an advantageous effect that the test of the abnormal voltage detection function can be easily conducted.

It is noted that the function of testing the abnormal voltage detection functions may be added to the abnormal voltage detector apparatus 300 according to the second preferred embodiment by mounting the voltage lowering circuits 41 to 4N to the abnormal voltage detectors 301 to 30N, respectively.

The abnormal voltage detector apparatus 400 includes a function of testing whether or not a failure occurs to the abnormal voltage detection function. Accordingly, even if the abnormal voltage detection function fails, there is no probability that the assembled battery 10 is continuously used without any knowledge of the failure of the abnormal voltage detection circuit and that the battery blocks B1 to BN are eventually overcharged or overdischarged.

In the third preferred embodiment, a voltage lowering circuit driving signal TC outputted from the voltage lowering circuit controller 454 is a one-bit signal. If the signal is a one-bit signal, only a result of collectively testing all the abnormal voltage detectors 401 to 40N is obtained. It is, therefore, preferable that the voltage lowering circuit driving signal TC outputted by the voltage lowering circuit controller 454 is an n-bit signal so as to individually test all the abnormal voltage detectors 401 to 40N.

Fourth Preferred Embodiment

Figure 13:
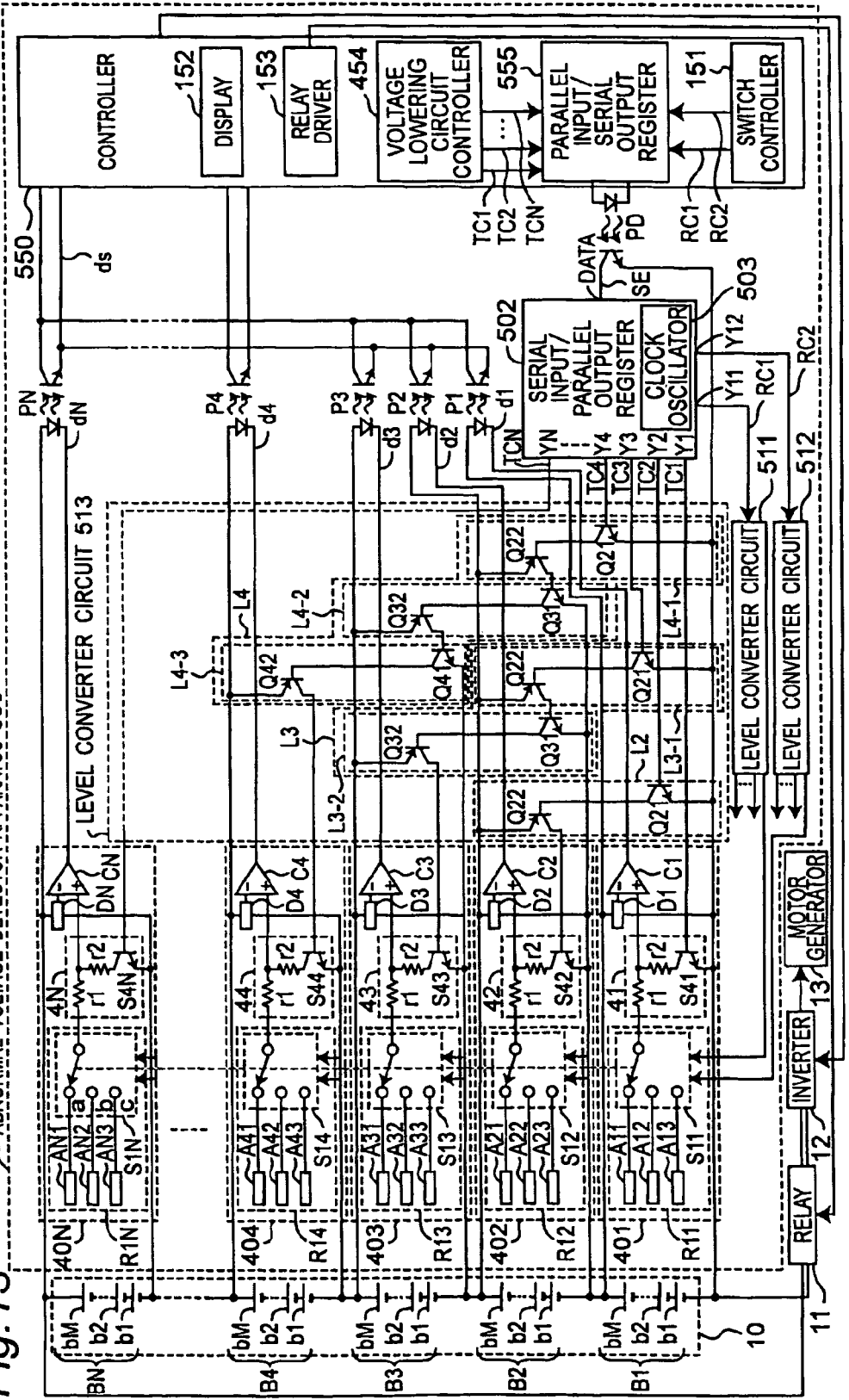
FIG. 13 is a block diagram showing a schematic configuration of an abnormal voltage detector apparatus for use in the assembled battery according to a fourth preferred embodiment of the present invention.

Referring to FIG. 13, an abnormal voltage detector apparatus 500 according to a fourth preferred embodiment of the present invention will be described. FIG. 13 is a block diagram showing a schematic configuration of the abnormal voltage detector apparatus 500 for use in the assembled battery 10 according to the fourth preferred embodiment of the present invention. In FIG. 13, components common to those shown in FIG. 12 are designated by common numerals, and their descriptions are omitted.

In the assembled battery abnormal voltage detector apparatus 400 according to the third preferred embodiment, a voltage difference between an output voltage level of the lowest-order battery block B1 and that of the highest-order battery block BN, the both battery blocks B1 and BN constituting the assembled battery 10, is equal to or higher than 270 V. Accordingly, it is necessary to provide the level converter circuits 111, 112 and 113 that convert voltage levels of the control signals RC1 and RC2 for controlling switchover of the switches S11 to S1N and voltage levels of the voltage lowering circuit driving signal TC for controlling the switches S41 to S4N, which constitutes the voltage lowering circuits 41 to 4N, respectively, to be opened or closed, into voltage levels at which the respective switches can be opened or closed. In the third preferred embodiment, if each of the level converter circuits 111, 112 and 113 is configured by a circuit element having a high withstand voltage up to about 270 V, a circuit scale of the abnormal voltage detector apparatus is disadvantageously made large and a cost thereof is disadvantageously increased, since such a high withstand voltage circuit element is expensive and large in size. The abnormal voltage detector apparatus 500 according to the fourth preferred embodiment, by contrast, includes a level converter circuit 513 configured by utilizing inexpensive and small switching devices having a low withstand voltage.

In the third preferred embodiment, a voltage lowering circuit driving signal TC outputted from the voltage lowering circuit controller 454 is a one-bit signal. If the signal is a one-bit signal, only a result of collectively testing all the abnormal voltage detectors 401 to 40N is obtained. The abnormal voltage detector apparatus 500 according to the fourth preferred embodiment can individually test all the abnormal voltage detectors 401 to 40N.

In FIG. 13, reference numeral 500 denotes the abnormal voltage detector apparatus, 10 denotes the assembled battery, 11 denotes the relay, 12 denotes the inverter, and 13 denotes the motor generator. The abnormal voltage detector apparatus 500, the assembled battery 10, the relay 11, the inverter 12, and the motor 13 are all installed in an electric vehicle. The DC power of the assembled battery 10 is converted into AC power by the inverter 12, and the AC power drives the motor generator 13, so that the electric vehicle runs. The relay 11 relays an electrical connection between the assembled battery 10 and the inverter 12.

The abnormal voltage detector apparatus 500 includes abnormal voltage detectors 401 to 40N, level converter circuits 511, 512 and 513, a serial input/parallel output register 502, photo-couplers PD, P1 to PN, and a controller 550. The abnormal voltage detector apparatus 500 according to the fourth embodiment has such a configuration that the serial input/parallel output register 502 is additionally provided in the abnormal voltage detector apparatus 400, the level converter circuits 111, 112 and 113, and the controller 450 are replaced with the level converter circuits 511, 512 and 513, and the controller 550, respectively, and the photo-couplers P11, P12 and P13 are replaced with the photo-coupler PD. Besides, each of the switches S41 to S4N is configured by an npn transistor.

The controller 550 has such a configuration that a parallel input/serial output register 555 is additionally provided in the controller 400 of the abnormal voltage detector apparatus 400. The switch controller 151 generates the control signals RC1 and RC2 for controlling switchover of the switches S11 to S1N. The voltage lowering circuit controller 454 generates voltage lowering circuit driving signals TC1 to TCN for controlling switchover of the switches S41 to S4N, respectively. The parallel input/serial output register 555 inputs the control signals RC1, RC2, and TC1 to TCN from its parallel input terminals, and sets the signals as data bits. Further, the parallel input/serial output register 555 additionally inserts start bits in front of the data bits as a header and stop bits in rear of the data bits. The start bits are, for example, two bits out of ten bits. The stop bits are, for example, two bits out of ten bits.

In this case, "1" is a level at which the LED of each photo-coupler emits light, and "0" is a level at which the LED of the photo-coupler PD is turned off. The parallel input/serial output register 555 outputs a serial data signal SE including the start bits, the data bits, and the stop bits, to an input LED of the photo-coupler PD. The start bits are control bits for automatically starting the reception-side serial input/parallel output register 502. The stop bits are control bits for automatically stopping the reception-side serial input/parallel output register 502. The stop bits may be omitted.

The phototransistor of the photo-coupler PD transmits the serial data to the serial input/parallel output register 502 in an electrically insulated state. The serial input/parallel output register 502 inputs the serial data signal SE. The serial input/parallel output register 502 automatically activates an internal clock oscillator 503 in response to the start bits contained in a header of the serial data signal SE, and reads therein the serial data signal SE by using a predetermined clock outputted from the clock oscillator 503. Concretely, if the phototransistor of the photo-coupler PD is turned on, the serial input/parallel output register 502 detects that serial data transfer is started. Next, at a timing at which the phototransistor of the photo-coupler PD is changed from turning ON to OFF (at a timing at which the start bits changes from "1" to "0"), the clock oscillator 503 starts outputting clock. A frequency of the clock outputted from the clock oscillator 503 is the same as that of an internal clock at which the parallel input/serial output register 555 outputs the serial data SE. The both clock are synchronized with each other.

The serial input/parallel output register 502 outputs only the data bits of the serial data signal SE from parallel output terminals Y1 to YN, Y11, and Y12 without outputting the start bits and the stop bits serving as the control signal. The parallel output terminals Y1 to Yn output voltage lowering circuit driving signals TC1 to TCN to the level converter circuit 513. It is noted "N" is equal to a total number of battery blocks B1 to BN. In the fourth preferred embodiment, "N" is preferably 20. Only the output terminals corresponding to the abnormal voltage detectors in which the voltage lowering circuits are to be activated are at High level among the parallel output terminals Y1 to YN. The parallel output terminals Y11 and Y12 output control signals RC1 and RC2 to the level converter circuits 511 and 512, respectively. The control signals RC1 and RC2 are distributed to the respective abnormal voltage detectors 401 to 40N via the level converter circuits 511 and 512. The level converter circuits 511 and 512 are similar in configuration to the level converter circuit 513 (it will be described later) except that an input signal is a one-bit signal and "n" output signals are outputted.

The controller 550 is electrically insulated from the high voltage assembled battery 10 by the photo-couplers PD and P1 to Pn.

The level converter circuit 513 will be described below. The level converter circuit 513 includes booster circuits L2, L3, . . . , and LN. A booster circuit Ln is provided for converting a voltage level of the voltage lowering circuit driving signal TCn outputted from a parallel output terminal Yn into a voltage level for controlling the voltage lowering circuit 4n of an n-th battery block Bn from a lowest-order voltage. In FIG. 13, only the booster circuits L2, L3 and L3 are shown.

An emitter electrode of the phototransistor that constitutes the photo-coupler PD and a ground terminal of the serial input/parallel output register 502 are connected to a negative electrode of the lowest-order battery block B1. The voltage levels of the voltage lowering circuit driving signals TC1 to TCN include a voltage of a negative electrode terminal of the assembled battery 10. The output terminal Y1 of the serial input/parallel output register 502 is directly connected to an input terminal of the voltage lowering circuit 41 (a base electrode of the npn transistor S41), without being subjected to level conversion.

The booster circuit L2 includes an npn transistor Q21 and a pnp transistor Q22. A base electrode of the npn transistor Q21 is connected to the output terminal Y2 of the serial input/parallel output register 502 and serves as an input terminal of the booster circuit L2. An emitter electrode of the npn transistor Q21 is connected to the negative electrode of the battery block B1, and a collector electrode thereof is connected to a base electrode of the pnp transistor Q22. An emitter electrode of the pnp transistor Q22 is connected to a positive electrode of the battery block B2. A collector electrode of the pnp transistor Q22 is connected to an input terminal of the voltage lowering circuit 42 (a base electrode of the npn transistor S42) and serves as an output terminal of the booster circuit L2.

The booster circuit L3 includes two pairs L3-1 and L3-2 of npn transistors and pnp transistors. Hereinafter, the pair of an npn transistors and a pnp transistor is referred to as a "pair". The pair L3-1 includes an npn transistor Q21 and a pnp transistor Q22. The pair L3-1 has a configuration similar to that of the booster circuit L2. The pair L3-2 includes an npn transistor Q31 and a pnp transistor Q32. A base electrode of the npn transistor Q21 of the pair L3-1 is connected to the output terminal Y3 of the serial input/parallel output register 502 and serves as an input terminal of the booster circuit L3. An emitter electrode of the npn transistor Q21 of the pair L3-1 is connected to the negative electrode of the battery block B1 and a collector electrode thereof is connected to a base electrode of the pnp transistor Q22 of the pair L3-1. An emitter electrode of the pnp transistor Q22 of the pair L3-1 is connected to the positive electrode of the battery block B2 and a collector electrode thereof is connected to a base electrode of the npn transistor Q31. An emitter electrode of the npn transistor Q31 is connected to a negative electrode of the battery block B2 and a collector electrode thereof is connected to a base electrode of the pnp transistor Q32. An emitter electrode of the pnp transistor Q32 is connected to a positive electrode of the battery block B3. A collector electrode of the pnp transistor Q32 is connected to an input terminal of the voltage lowering circuit 43 (a base electrode of the npn transistor S43) and serves as an output terminal of the booster circuit L3.

The booster circuit L4 includes three pairs L4-1, L4-2 and L4-3 of npn transistors and pnp transistors. The pair L4-1 includes an npn transistor Q21 and a pnp transistor Q22. The pair L4-1 has a configuration similar to that of the pair L3-1. The pair L4-2 includes an npn transistor Q31 and a pnp transistor Q32. The pair L4-2 has a configuration similar to that of the pair L3-2. The pair L4-3 includes an npn transistor Q41 and a pnp transistor Q42. A base electrode of the npn transistor Q21 of the pair L4-1 is connected to the output terminal Y4 of the serial input/parallel output register 502 and serves as an input terminal of the booster circuit L4. An emitter electrode of the npn transistor Q21 of the pair L4-1 is connected to the negative electrode of the battery block B1 and a collector electrode thereof is connected to a base electrode of the pnp transistor Q22 of the pair L4-1. An emitter electrode of the pnp transistor Q22 of the pair L4-1 is connected to the positive electrode of the battery block B2 and a collector electrode thereof is connected to a base electrode of the npn transistor Q31 of the pair L4-2. An emitter electrode of the npn transistor Q31 of the pair L4-2 is connected to the negative electrode of the battery block B2 and a collector electrode thereof is connected to a base electrode of the pnp transistor Q32 of the pair L4-2. An emitter electrode of the pnp transistor Q32 of the pair L4-2 is connected to the positive electrode of the battery block B3. A collector electrode of the pnp transistor Q32 of the pair L4-2 is connected to a base electrode of the npn transistor Q41. An emitter electrode of the npn transistor Q41 is connected to the negative electrode of the battery block B3 and a collector electrode thereof is connected to a base electrode of the pnp transistor Q42. An emitter electrode of the pnp transistor Q42 is connected to the positive electrode of the battery block B4. A collector electrode of the pnp transistor Q42 is connected to an input terminal of the voltage lowering circuit 44 (a base electrode of the npn transistor S44) and serves as an output terminal of the booster circuit L4.

In a similar way, an input terminal of the n-th booster circuit Ln is connected to the n-th output terminal Yn of the serial input/parallel output register 502, and an output terminal thereof is connected to an input terminal of the n-th voltage lowering circuit 4n (a base electrode of an npn transistor S4n). The booster circuit Ln includes (n−1) pairs of npn transistors and pnp transistors. Therefore, the level converter circuit 513 includes N(N−1)/2 npn transistors and N(N−1)/2 pnp transistors. In the fourth preferred embodiment, the level converter circuit 513 includes 190 npn transistors and 190 pnp transistors.

An operation of the booster circuit L2 will be described. If a signal on the input terminal of the booster circuit L2 is at High level, a base current of the npn transistor Q21 flows in the base electrode of the npn transistor Q21 and the npn transistor Q21 turns on. Therefore, a base current flows in the base electrode of the pnp transistor Q22, and the pnp transistor Q22 also turns on. A voltage on an output terminal of the booster circuit L2 (a collector electrode of the pnp transistor Q22) is boosted up to a voltage close to a positive electrode terminal voltage of 28.8 V of the battery block B2. That is, a signal having High level is outputted from the booster circuit L2 to the switch S42.

When the signal on the input terminal of the booster circuit L2 is at Low level, the npn transistor Q21 is turned off. Therefore, no current flows between the base electrode of the pnp transistor Q22 and the negative electrode of the battery block B1. That is, the pnp transistor Q22 is turned off, and a signal having Low level (which is a voltage close to a negative electrode terminal voltage of 14.4 V of the battery block B2) is outputted from the booster circuit L2 to the voltage lowering circuit 42.

As described above, the booster circuit L2 converts the voltage level of the input signal TC2 for the battery block B2, into the voltage level at which the voltage lowering circuit 42 can operate, i.e., the positive electrode terminal voltage or the negative electrode terminal voltage of the battery block B2, by utilizing voltage differences each between electrodes of each of transistors Q21 and Q22, and outputs the boosted signal TC2 to the voltage lowering circuit 42. The booster circuit L2 boosts the voltage level of the signal TC2 for the battery block B2 only by a unit voltage, which is a voltage between the terminals of the battery block B2, to convert the voltage level thereof into the converted voltage level, that is the voltage level of the battery block B2.

An operation of the booster circuit L3 will be described. If a signal on the input terminal of the booster circuit L3 is at High level, a base current of the npn transistor Q21 of the pair L3-1 flows in the base electrode of the npn transistor Q21 and the npn transistor Q21 turns on. Therefore, a base current flows in the base electrode of the pnp transistor Q22 of the pair L3-1, and then the pnp transistor Q22 also turns on. A base current of the npn transistor Q31 flows in the base electrode of the npn transistor Q31 and the npn transistor Q31 turns on. Therefore, a base current flows in the base electrode of the pnp transistor Q32, and then, the pnp transistor Q32 also turns on. A voltage on an output terminal of the booster circuit L3 (a collector electrode of the pnp transistor Q32) is boosted up to a voltage close to a positive electrode terminal voltage of 43.2 V of the battery block B3. That is, a signal having High level is outputted from the booster circuit L3 to the switch S43.

When the signal on the input terminal of the booster circuit L3 is at Low level, the npn transistor Q21 of the pair L3-1 is turned off. Therefore, no current flows between the base electrode of the pnp transistor Q22 of the pair L3-1 and the negative electrode of the battery block B1. That is, the pnp transistor Q22 is turned off. In a similar way, the npn transistor Q31 and the pnp transistor Q32 are also turned off. That is, a signal having Low level (which is a voltage close to a negative electrode terminal voltage of 28.2 V of the battery block B3) is outputted from the booster circuit L3 to the voltage lowering circuit 43.

As described above, in the booster circuit L3, the voltage level of High level of the input signal TC3 is converted into the voltage level close to the positive electrode terminal voltage of the battery block B2 by the pair L3-1 (the npn transistor Q21 and the pnp transistor Q22). The voltage level of the input signal TC3 is further converted into the voltage level close to the positive electrode terminal voltage of the battery block B3 by the pair L3-2 (the npn transistor Q31 and the pnp transistor Q32) and outputted to the voltage lowering circuit 43. The booster circuit L3 converts the voltage level of the input signal TC3 into the voltage level at which the voltage lowering circuit 43 can operate, i.e., the voltage level on both ends of the battery block B3, and outputs the boosted signal TC3 to the voltage lowering circuit 43, by utilizing voltage differences each between electrodes of each of transistors Q21, Q22, Q31, and Q32.

The booster circuits L4 to LN operate similarly. Namely, in the booster circuit Ln, the voltage level of the input signal TCn is boosted up to the positive electrode terminal voltage of the battery block B2 by the first pair of the npn transistor and the pnp transistor, and further boosted by as much as the voltage of 14.4 V between the terminals of the battery block by each of the second to the (n−1)-th pairs of the npn transistors and the pnp transistors. The voltage level of the input signal TCn of the booster circuit Ln is converted into the voltage level of the positive electrode terminal or that of the negative electrode of the battery block Bn.

In the abnormal voltage detector apparatus 500 according to the fourth preferred embodiment, a voltage between the terminals of each of said battery blocks is assumed to be a unit voltage, and respective booster circuits L2 to LN of FIG. 13 boost voltage levels of respective control signals TC2 to TCN stepwise by a unit voltage to convert the voltage levels thereof into respective converted voltage levels, that are voltage levels of respective battery blocks B2 to BN.

A method for detecting whether or not the abnormal voltage detector apparatus 500 operates normally will be described. It is noted that the test of the abnormal voltage detection function is conducted while all the battery blocks B1 to BN are not overcharged yet (e.g., before charging or before the electric vehicle moves).

First of all, in the first test processing, the switches S41 to S4N of the abnormal voltage detectors 401 to 40N are opened and the switches S11 to S1N are switched over to the contact "a" thereof, respectively. The first reference voltages Vr1 generated by the reference voltage sources A11 to AN1 are applied to the non-inverted input terminals of the comparators C1 to CN without processing them, respectively. If the output voltages of the battery blocks B1 to BN are in a normal state and the reference voltage sources A11 to AN1, the voltage division circuits D1 to DN, and the comparators C1 to CN are in a normal state, the logical sum signal ds is at High level.

Next, in the second test processing, with the switches S41 to S4N kept open, the switches S11 to S1N are switched over to the contact "b" thereof, respectively. If the output voltages of the battery blocks B1 to BN are in a normal state and the reference voltage sources A12 to AN2, the voltage division circuits D1 to DN, and the comparators C1 to CN are in a normal state, the logical sum signal ds is at High level.

Next, in the third test processing, with the switches S41 to S4N kept open, the switches S11 to S1N are switched over to the contact "c" thereof, respectively. If the output voltages of the battery blocks B1 to BN are in a normal state and the reference voltage sources A13 to AN3, the voltage division circuits D1 to DN, and the comparators C1 to CN are in a normal state, the logical sum signal ds is at High level.

Next, in the fourth, fifth and sixth test processings, the abnormality detecting function of the abnormal voltage detector 401 is tested. In the fourth test processing, the switch S41 is closed, and the switches S11 to S1N are switched over to the contacts "a" thereof. The first reference voltages Vr1 generated by the reference voltage sources A11 to AN1 are divided by the resistance values of the resistors r1 and r2, respectively. The divided voltages are applied to the non-inverted input terminals of the comparators C1 to CN, respectively. If the reference voltage sources A11 to AN1, the voltage division circuits D1 to DN, and the comparators C1 to CN are in a normal state, the logical sum signal ds is at Low level.

Next, in the fifth test processing, with the switch S41 kept closed, the switches S11 to S1N are switched over to the contacts "b" thereof. If the reference voltage sources A12 to AN2, the voltage division circuits D1 to DN, and the comparators C1 to CN are in a normal state, the logical sum signal ds is at Low level.

Next, in the sixth test processing, with the switch S41 kept closed, the switches S11 to S1N are switched over to the contacts "c" thereof. If the reference voltage sources A13 to AN3, the voltage division circuits D1 to DN, and the comparators C1 to CN are in a normal state, the logical sum signal ds is at Low level.

The controller 450 controls the operations of the switches S11 to S1N, and S41 to S4N as the first to the sixth test processings. The controller 450 decides that the abnormal voltage detector 401 operates normally, in the case that the levels of the logical sum signal ds in the above-mentioned test processings are at the same levels as the above-mentioned levels, and decides that the abnormal voltage detector 401 is broken in other cases.

In a similar way, the controller 450 sequentially tests abnormal voltage detection functions of the abnormal voltage detectors 402 to 40N. The controller 450 controls a display 152 to display test results of the abnormal voltage detection functions of the abnormal voltage detectors 401 to 40N by, for example, turning on a lamp.

The voltage applied to each of the pnp transistors and the npn transistors that constitute the level converter circuit 513 is approximately a voltage of 14.4 V between the terminals of one battery block or approximately twice the voltage of 28.8 V. Accordingly, the level converter circuit 513 can be easily integrated into an IC using existing semiconductor devices having a low withstand voltage of approximately 40 V. Furthermore, the abnormal voltage detector apparatus 500 generates the serial data signal SE that includes control signals RC1, RC2 and TC1 to TCN. The abnormal voltage detector apparatus 500 can transmits control signals RC1, RC2 and TC1 to TCN only via one photo-coupler PD.

Normally, a serial input/parallel output register includes a data input terminal for inputting serial input data, a reset terminal for inputting a reset signal, and a clock input terminal for inputting a clock. The serial input/parallel output register 502 includes only a data input terminal for inputting serial input data SE and does not include the reset terminal for inputting a reset signal and the clock input terminal for inputting a clock. The serial input/parallel output register 502 inputs the serial input data via one transmission element PD having an input terminal pair and an output terminal pair which are electrically insulated from each other isolated from each other. According to the fourth preferred embodiment, only by additionally providing an inexpensive and small-sized circuit element in the abnormal voltage detector apparatus that does not include the function of testing the abnormal voltage detection function, the function of testing the abnormal voltage detection function can be added to the apparatus.

The level converter circuit 513 and the serial input/parallel output register 502 may be employed to control the switches S31 to S3N of the abnormal voltage detector apparatus 300 according to the second preferred embodiment.

The configuration of the abnormal voltage detector apparatus 500 according to the fourth preferred embodiment may be replaced by the following configuration. The controller 550 outputs a reset signal. The reset signal outputted from the controller 550 is transmitted to the parallel input/serial output register 555 and the serial input/parallel output register 502. The controller 550 transmits the reset signal to the serial input/parallel output register 502 via a photo-coupler PR. The photo-coupler PR transmits the reset signal while the controller 550 is isolated from the serial input/parallel output register 502.

If the controller 550 outputs the reset signal, the parallel input/serial output register 555 automatically loads two-bit control signals and n-bit control signals inputted to its parallel terminal at a rising edge. In addition, clock oscillators included in both the parallel input/serial output register 555 and the serial input/parallel output register 502 simultaneously and automatically start outputting clocks. The clock oscillators included in both the parallel input/serial output register 555 and the serial input/parallel output register 502 are equal in oscillation clock frequency and synchronized with each other. The parallel input/serial output register 555 outputs serial data, and the serial input/parallel output register 502 accurately reads the serial data inputted via the photo-coupler PD.

Fifth Preferred Embodiment

Figure 14:
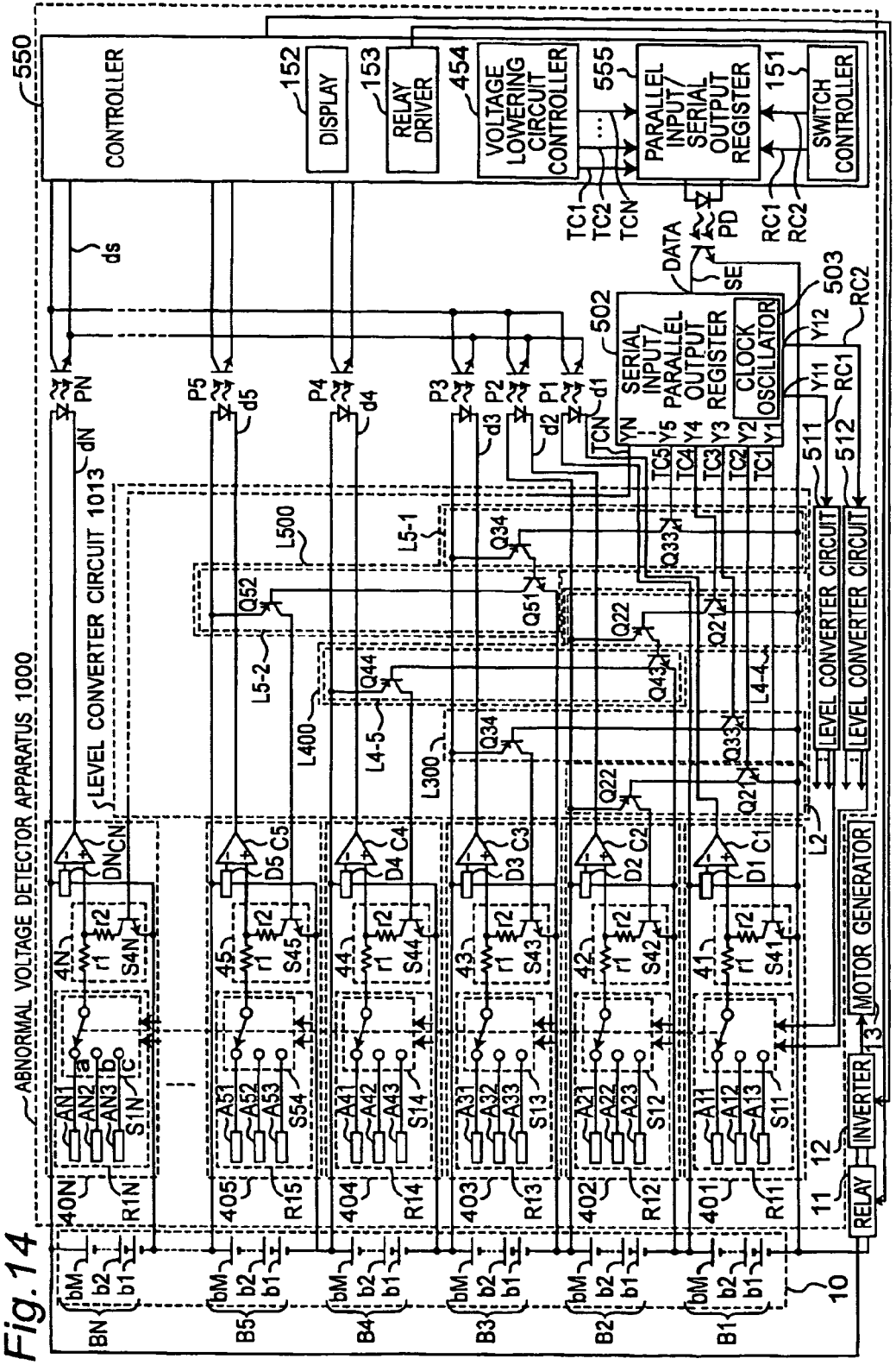
FIG. 14 is a block diagram showing a schematic configuration of an abnormal voltage detector apparatus for use in the assembled battery according to a fifth preferred embodiment of the present invention.

Referring to FIG. 14, an abnormal voltage detector apparatus 1000 according to a fifth preferred embodiment of the present invention will be described. FIG. 14 is a block diagram showing a schematic configuration of the abnormal voltage detector apparatus 1000 for use in the assembled battery 10 according to the fifth preferred embodiment of the present invention. In FIG. 14, components common to those shown in FIG. 13 are designated by common numerals, and their descriptions are omitted.

In the abnormal voltage detector apparatus 500 according to the fourth preferred embodiment, the voltage between the terminals of each of battery blocks B1 to BN is used as the unit voltage. Respective booster circuits L2 to LN of FIG. 13 boost voltage levels of respective control signals TC2 to TCN stepwise by a unit voltage to convert the voltage levels thereof into respective converted voltage levels, that are voltage levels of respective battery blocks B2 to BN. The level converter circuit 1013 of the fifth preferred embodiment includes level booster circuits L300 to LN00 each of which boosts the voltage level of the inputted control signal by a plurality of unit voltages to convert the voltage level thereof into the converted voltage level.

The abnormal voltage detector apparatus 1000 has such a configuration that the level converter circuit 513 of the abnormal voltage detector apparatus 500 of FIG. 13 according to the fourth preferred embodiment is replaced with a level converter circuit 1013. The other configurations of the abnormal voltage detector apparatus 1000 are similar to that of the abnormal voltage detector apparatus 500 according to the fourth preferred embodiment.

The configuration and the operation of the level converter circuit 1013 are described below. The level converter circuits 1013 includes booster circuits L2, L300, L400, L500, . . . , LN00. The level converter circuit 1013 has such a configuration that the booster circuits L3 to LN of the level converter circuit 513 are replaced with the booster circuits L300 to LN00. A booster circuit Ln00 is provided for converting a voltage level of the voltage lowering circuit driving signal TCn outputted from a parallel output terminal Yn into a voltage level for controlling the voltage lowering circuit 4n of an n-th battery block Bn from a lowest-order voltage. In FIG. 14, only the booster circuits L2 and L300 L400, and L500 are shown. The configurations and the operations of the booster circuits L300 to LN00 are described below.

The booster circuit L300 includes an npn transistor Q33 and a pnp transistor Q34. A base electrode of the npn transistor Q33 is connected to the output terminal Y3 of the serial input/parallel output register 502 and serves as an input terminal of the booster circuit L300. An emitter electrode of the npn transistor Q33 is connected to the negative electrode of the battery block B1, and a collector electrode thereof is connected to a base electrode of the pnp transistor Q34. An emitter electrode of the pnp transistor Q34 is connected to a positive electrode of the battery block B3. A collector electrode of the pnp transistor Q34 is connected to the input terminal of the voltage lowering circuit 43 (a base electrode of the npn transistor S43) and serves as an output terminal of the booster circuit L300.

The booster circuit L400 includes two pairs L4-4 and L4-5 of npn transistors and pnp transistors. The pair L4-4 includes an npn transistor Q21 and a pnp transistor Q22. The pair L4-4 has a configuration similar to that of the booster circuit L2. The pair L4-5 includes an npn transistor Q43 and a pnp transistor Q44. A base electrode of the npn transistor Q21 of the pair L4-4 is connected to the output terminal Y4 of the serial input/parallel output register 502 and serves as an input terminal of the booster circuit L400. An emitter electrode of the npn transistor Q21 of the pair L4-4 is connected to the negative electrode of the battery block B1 and a collector electrode thereof is connected to a base electrode of the pnp transistor Q22 of the pair L4-4. An emitter electrode of the pnp transistor Q22 of the pair L4-4 is connected to the positive electrode of the battery block B2 and a collector electrode thereof is connected to a base electrode of the npn transistor Q43. An emitter electrode of the npn transistor Q43 is connected to a negative electrode of the battery block B2 and a collector electrode thereof is connected to a base electrode of the pnp transistor Q44. An emitter electrode of the pnp transistor Q44 is connected to a positive electrode of the battery block B4. A collector electrode of the pnp transistor Q44 is connected to an input terminal of the voltage lowering circuit 44 (a base electrode of the npn transistor S44) and serves as an output terminal of the booster circuit L400.

The booster circuit L500 includes two pairs L5-1 and L5-2 of npn transistors and pnp transistors. The pair L5-1 includes an npn transistor Q33 and a pnp transistor Q34. The pair L5-1 has a configuration similar to that of the booster circuit L300. The pair L5-2 includes an npn transistor Q51 and a pnp transistor Q52. A base electrode of the npn transistor Q33 of the pair L5-1 is connected to the output terminal Y5 of the serial input/parallel output register 502 and serves as an input terminal of the booster circuit L500. An emitter electrode of the npn transistor Q33 of the pair L5-1 is connected to the negative electrode of the battery block B1 and a collector electrode thereof is connected to a base electrode of the pnp transistor Q34 of the pair L5-1. An emitter electrode of the pnp transistor Q34 of the pair L5-1 is connected to the positive electrode of the battery block B3 and a collector electrode thereof is connected to a base electrode of the npn transistor Q51. An emitter electrode of the npn transistor Q51 is connected to a negative electrode of the battery block B3 and a collector electrode thereof is connected to a base electrode of the pnp transistor Q52. An emitter electrode of the pnp transistor Q52 is connected to a positive electrode of the battery block B5. A collector electrode of the pnp transistor Q52 is connected to an input terminal of the voltage lowering circuit 45 (a base electrode of the npn transistor S45) and serves as an output terminal of the booster circuit L500.

In a similar way, an input terminal of the n-th booster circuit Ln00 is connected to the n-th output terminal Yn of the serial input/parallel output register 502, and an output terminal thereof is connected to an input terminal of the n-th voltage lowering circuit 4n (a base electrode of an npn transistor S4n.

An operation of the booster circuit L300 will be described. If a signal TC3 on the input terminal of the booster circuit L300 is at High level, a base current of the npn transistor Q33 flows in the base electrode of the npn transistor Q33 and the npn transistor Q33 turns on. Therefore, a base current flows in the base electrode of the pnp transistor Q34, and the pnp transistor Q34 also turns on. A voltage on an output terminal of the booster circuit L300 (a collector electrode of the pnp transistor Q34) is boosted up to a voltage close to a positive electrode terminal voltage of 43.2 V of the battery block B3. That is, a signal having High level is outputted from the booster circuit L300 to the switch S43.

When the signal TC3 on the input terminal of the booster circuit L300 is at Low level, the npn transistor Q33 is turned off. Therefore, no current flows between the base electrode of the pnp transistor Q34 and the negative electrode of the battery block B1. That is, the pnp transistor Q34 is turned off, and a signal having Low level (which is a voltage close to a negative electrode terminal voltage of 28.8 V of the battery block B3) is outputted from the booster circuit L300 to the voltage lowering circuit 43.

As described above, the booster circuit L300 converts the voltage level of the input signal TC3 for the battery block B3, into the voltage level at which the voltage lowering circuit 43 can operate, i.e., the positive electrode terminal voltage or the negative electrode terminal voltage of the battery block B3, by utilizing voltage differences each between electrodes of each of transistors Q33 and Q34, and outputs the boosted signal TC3 to the voltage lowering circuit 43. The booster circuit L300 boosts the voltage level of the signal TC3 for the battery block B3 by twice the voltage across the battery block, to convert the voltage level thereof into the converted voltage level, that is the voltage level of the battery block B3.

An operation of the booster circuit L400 will be described. If a signal on the input terminal of the booster circuit L400 is at High level, a base current of the npn transistor Q21 of the pair L4-4 flows in the base electrode of the npn transistor Q21 and the npn transistor Q21 turns on. Therefore, a base current flows in the base electrode of the pnp transistor Q22 of the pair L4-4, and the pnp transistor Q22 also turns on. A base current of the npn transistor Q43 flows in the base electrode of the npn transistor Q43 and the npn transistor Q43 turns on. Therefore, a base current flows in the base electrode of the pnp transistor Q44, and the pnp transistor Q44 also turns on. A voltage on an output terminal of the booster circuit L400 (a collector electrode of the pnp transistor Q44) is boosted up to a voltage close to a positive electrode terminal voltage of 57.6 V of the battery block B4. That is, a signal having High level is outputted from the booster circuit L400 to the switch S44.

When the signal on the input terminal of the booster circuit L400 is at Low level, the npn transistor Q21 of the pair L4-4 is turned off. Therefore, no current flows between the base electrode of the pnp transistor Q22 of the pair L4-4 and the negative electrode of the battery block B1. That is, the pnp transistor Q22 is turned off. In a similar way, the npn transistor Q43 and the pnp transistor Q44 are also turned off. That is, a signal having Low level (which is a voltage close to a negative electrode terminal voltage of 43.2 V of the battery block B4) is outputted from the booster circuit L400 to the voltage lowering circuit 44.

As described above, in the booster circuit L400, the voltage level of High level of the input signal TC4 is converted into the voltage level close to the positive electrode terminal voltage of the battery block B2 by the pair L4-4 (the npn transistor Q21 and the pnp transistor Q22). The voltage level of the input signal TC4 is further converted into the voltage level close to the positive electrode terminal voltage of the battery block B4 by the pair L4-5 (the npn transistor Q43 and the pnp transistor Q44) and outputted to the voltage lowering circuit 44. The booster circuit L400 converts the voltage level of the input signal TC4 into the voltage level at which the voltage lowering circuit 44 can operate, i.e., the voltage level on both ends of the battery block B4, and outputs the boosted signal TC4 to the voltage lowering circuit 44, by utilizing voltage differences each between electrodes of each of transistors Q21, Q22, Q43, and Q44. The booster circuit L400 boosts the voltage level of the signal TC4 for the battery block B4 by twice the voltage across the battery block, and then boosts the boosted voltage level by the voltage across the battery block to convert the voltage level thereof into the converted voltage level, that is the voltage level of the battery block B4.

An operation of the booster circuit L500 will be described. If a signal on the input terminal of the booster circuit L500 is at High level, a base current of the npn transistor Q33 of the pair L5-1 flows in the base electrode of the npn transistor Q33 and the npn transistor Q33 turns on. Therefore, a base current flows in the base electrode of the pnp transistor Q34 of the pair L5-1, and the pnp transistor Q34 also turns on. A base current of the npn transistor Q51 flows in the base electrode of the npn transistor Q51 and the npn transistor Q51 turns on. Therefore, a base current flows in the base electrode of the pnp transistor Q52, and the pnp transistor Q52 also turns on. A voltage on an output terminal of the booster circuit L500 (a collector electrode of the pnp transistor Q52) is boosted up to a voltage close to a positive electrode terminal voltage of 72.0 V of the battery block B5. That is, a signal having High level is outputted from the booster circuit L500 to the switch S45.

When the signal on the input terminal of the booster circuit L500 is at Low level, the npn transistor Q33 of the pair L5-1 is turned off. Therefore, no current flows between the base electrode of the pnp transistor Q34 of the pair 5-1 and the negative electrode of the battery block B1. That is, the pnp transistor Q34 is turned off. In a similar way, the npn transistor Q51 and the pnp transistor Q52 are also turned off. That is, a signal having Low level (which is a voltage close to a negative electrode terminal voltage of 57.6 V of the battery block B5) is outputted from the booster circuit L400 to the voltage lowering circuit 45.

As described above, in the booster circuit L500, the voltage level of High level of the input signal TC5 is converted into the voltage level close to the positive electrode terminal voltage of the battery block B3 by the pair L5-1 (the npn transistor Q33 and the pnp transistor Q34). The voltage level of the input signal TC4 is further converted into the voltage level close to the positive electrode terminal voltage of the battery block B5 by the pair L5-2 (the npn transistor Q51 and the pnp transistor Q52) and outputted to the voltage lowering circuit 45. The booster circuit L500 converts the voltage level of the input signal TC5 into the voltage level at which the voltage lowering circuit 45 can operate, i.e., the voltage level on both ends of the battery block B5, and outputs the boosted signal TC5 to the voltage lowering circuit 45, by utilizing voltage differences each between electrodes of each of transistors Q33, Q34, Q51, and Q52.

The subsequent booster circuits L600 to Ln00 also operate similarly. By using pairs of pnp and npn transistors, the voltage level of a signal having High level is boosted by the voltage (14.4 V in the preferred embodiment) between the terminals of one battery block or two battery blocks. For example, each of the booster circuit L2 and the pair L4-4 of the booster circuit L400 boost a voltage level of the inputted signal by the voltage (14.4 V in the preferred embodiment) between the terminals of one battery block. Each of the booster circuit L300, the pair L4-5 of the booster circuit L400, the pairs L5-1 and L5-2 of the booster circuit L500 preferably boost a voltage level of the inputted signal by a voltage of 28.8 V between the terminals of two battery blocks in the preferred embodiment. The voltage levels of the control signals TC3, TC5, TC7, . . . for the battery blocks B3, B5, B7, . . . are boosted sequentially by the voltage between the terminals of two battery blocks. The voltage levels of the control signals TC4, TC6, TC8, . . . for the battery blocks B4, B6, B8, . . . are boosted by the voltage between the terminals of one battery block, and then boosted sequentially by the voltage between the terminals of two battery blocks. In the end, the voltage levels of the control signals TC2 to TCN are converted into such levels the positive electrode of the battery block B2 to BN are used as reference voltages, and then the obtained signals are outputted to the level lowering circuits 42 to 4N, respectively.

The voltage applied to each of the pnp and npn transistors constituting the level converter circuit 1013 is approximately the voltage of 14.4 V between the terminals of one battery block or approximately twice the voltage of 28.8 V or three times the voltage of 43.2 V. Therefore, the level converter circuit 1013 can be easily integrated into an IC using existing semiconductor devices having a relatively low withstand voltage of approximately 50 V. With the fifth preferred embodiment, an abnormal voltage detection apparatus for use in an assembled battery, being inexpensive and small, can be provided.

The configuration of the level converter circuit 1013 is not limited to that shown in FIG. 14. In the booster circuit Lk00 according to the fifth preferred embodiment, the voltage level of the input signal is boosted by the voltage of 14.4 V between the terminals of one battery block or two battery blocks of 28.8 V. Instead of this value, in the high-order booster circuit, the voltage level of the input signal may be also boosted by three times the voltage between the terminals of the battery block. However, the decrement for the voltage level is determined by the trade-off between the withstand voltage level of the pnp and npn transistors constituting the booster circuit and the voltage between the terminals of the battery block. The pnp transistors and the npn transistors that constitute the level converter circuit 1013 may be replaced by the other switching elements.

Sixth Preferred Embodiment

Figure 15:
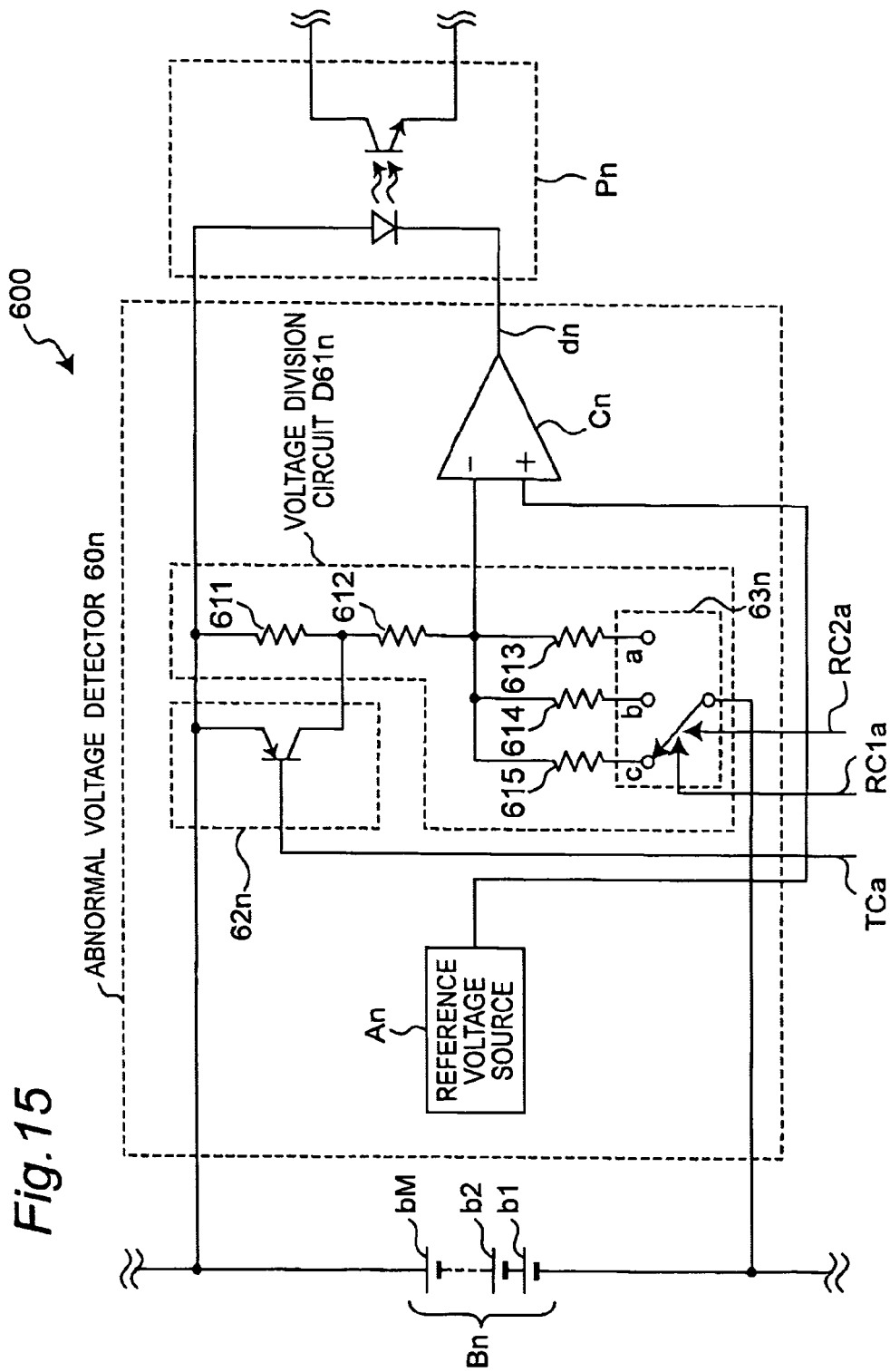
FIG. 15 is a block diagram showing a schematic configuration of an abnormal voltage detector apparatus for use in the assembled battery according to a sixth preferred embodiment of the present invention.

Referring to FIG. 15, an abnormal voltage detector apparatus 600 according to a sixth preferred embodiment of the present invention will be described.

The abnormal voltage detector apparatus 600 according to the sixth preferred embodiment has such a configuration that the abnormal voltage detectors 401 to 40N of the abnormal voltage detector apparatus 400 of FIG. 12 according to the third preferred embodiment are replaced with abnormal voltage detectors 601 to 60N. Only configurations of the abnormal voltage detectors 601 to 60N according to the sixth preferred embodiment will be, therefore, described herein.

FIG. 15 is a block diagram showing a schematic configuration of an abnormal voltage detector 60$n$ (where "n" is an arbitrary positive integer that satisfies 1≦n≦N) of the abnormal voltage detector apparatus 600. Since the abnormal voltage detectors 601 to 60N are all equal in configuration, the configuration of the abnormal voltage detector 60$n$ will be described herein. Respective abnormal voltage detectors 401 to 40N of the abnormal voltage detector apparatus 400 generates three reference voltages Vr1, Vr2 and Vr3, and compares the respective battery measuring voltages Vb1 to VbN, each of which is lowered from a voltage of the corresponding battery block, with the reference voltages Vr1, Vr2 and Vr3. Instead of this, each of the abnormal voltage detectors 601 to 60N of the abnormal voltage detector apparatus 600 compares a plurality of voltages lowered from the voltage of each corresponding battery block with a reference voltage.

The abnormal voltage detector 60$n$ shown in FIG. 15 includes a reference voltage source An, a voltage division circuit D61$n$, a pnp transistor 62$n$, and a comparator Cn. The abnormal voltage detector 60$n$ detects whether or not a voltage of a battery block Bn is abnormal (the battery block Bn is overcharged in the sixth preferred embodiment). The reference voltage source An consists of a Zener diode (not shown)

and a resistor (not shown), an output terminal of which is connected to a non-inverted input terminal of the comparator Cn. The configuration of the reference voltage source An is similar to that of the reference voltage source An provided in the abnormal voltage detector apparatus 300 according to the second preferred embodiment.

A configuration of the voltage division circuit D61n will be described. A series connection of resistors 611 and 612 is connected between a positive electrode terminal of the battery block Bn and an inverted input terminal of the comparator Cn. The pnp transistor 62n is connected in parallel to the resistor 611. One end of each of three registers 613, 614, and 615 is connected to the inverted input terminal of the comparator Cn. In the sixth preferred embodiment, resistance values of the three resistors 613, 614, and 615 are set to satisfy that (resistor 613)>(resistor 614)>(resistor 615). A common terminal common to three switches that constitute the switch 63n is connected to the negative electrode terminal of the battery block Bn. Three terminals "a", "b", and "c" of the three switches are connected to the other ends of the three registers 613, 614, and 615, respectively. The switches 631 to 63N operate simultaneously. The pnp transistors 621 to 62N operate simultaneously.

The voltage lowering circuit controller 454 of FIG. 12 generates a control signal TCa for controlling the operation of the pnp transistor 62n, instead of the control signal TC. The control signal TCa is outputted to a base electrode of the pnp transistor 62n via the photo-coupler P13 and the level converter circuit 113. The switch controller 151 (See FIG. 12) generates control signals RC1a and RC2a for controlling the operation of the switch 63n, instead of the control signals RC1 and RC2. The control signals RC1a and RC2a are outputted to the switch 63n via the photo-coupler P1 and the level converter circuit 111, and via the photo-coupler P12 and the level converter circuit 112, respectively.

An operation of the abnormal voltage detector 60n will be described. In an ordinary operation, the control signal TCa is at High level and the pnp transistor 62n is turned off. This ordinary operation will be described. The switch 63n grounds the resistor 613 in response to the control signals RC1a and RC2a. When the resistor 613 is grounded, a voltage of the battery block Bn is divided by the resistors 611, 612 and 613, and a divided voltage is outputted to the inverted input terminal of the comparator Cn. When a voltage of 18V, at which voltage the battery block Bn is slightly overcharged, is inputted to the voltage division circuit D61n, a voltage outputted to the inverted input terminal of the comparator Cn is similar to that of the reference voltage outputted by the reference voltage source An. The comparator Cn generates an abnormality detecting signal dn having Low level, when the voltage of the battery block Bn is higher than 18 V. The comparator Cn generates an abnormality detecting signal dn having High level, when the voltage of the battery block Bn is lower than 18 V The comparator Cn outputs the abnormality detecting signal dn to the photo-coupler Pn.

The switch 63n grounds the resistor 614 in response to the control signals TC1a and TC2a. When the resistor 614 is grounded and the pnp transistor 62n is turned off, a voltage of the battery block Bn is divided by the resistors 611, 612 and 614, and a divided voltage is outputted to the inverted input terminal of the comparator Cn. When a voltage of 20V, at which voltage the battery block Bn is greatly overcharged, is inputted to the voltage division circuit D61n, a voltage outputted to the inverted input terminal of the comparator Cn is similar to that of the reference voltage outputted by the reference voltage source An. The comparator Cn generates an abnormality detecting signal dn having Low level, when the voltage of the battery block Bn is higher than 20 V. The comparator Cn generates an abnormality detecting signal dn having High level, when the voltage of the battery block Bn is lower than 20 V.

The switch 63n grounds the resistor 615 in response to the control signals TC1a and TC2a. When the resistor 615 is grounded and the pnp transistor 62n is turned off, a voltage of the battery block Bn is divided by the resistors 611, 612 and 615, and a divided voltage is outputted to the inverted input terminal of the comparator Cn. When a voltage of 22V, at which voltage a failure occurs to the battery block Bn to make the battery block Bn unrestored, is inputted to the voltage division circuit D61n, a voltage outputted to the inverted input terminal of the comparator Cn is similar to that of the reference voltage outputted by the reference voltage source An. The comparator Cn generates an abnormality detecting signal dn having Low level, when the voltage of the battery block Bn is higher than 22 V. The comparator Cn generates an abnormality detecting signal dn having High level, when the voltage of the battery block Bn is lower than 22 V.

The logical sum of the abnormality detecting signals d1 to dN is calculated. The controller 450 (See FIG. 12) inputs the logical sum signal ds of the abnormality detecting signals d1 to dN. The abnormal voltage detector apparatus 600 according to the sixth preferred embodiment changes each of the three battery measuring voltages generated by the voltage division circuits D611 to D61N relative to the reference voltage generated by the reference voltage sources A1 to AN, respectively, and generates each of the abnormality detecting signals d1 to dN by comparing each of battery measuring voltages with the reference voltage. The controller 450 detects whether or not the abnormal voltage detector apparatus operates normally based on the logical sum signal ds of the abnormality detecting signals d1 to dN. A method for detecting whether or not the abnormal voltage detector apparatus 600 operates normally will be described.

It is noted that the abnormal voltage detection function test is conducted while all the battery blocks B1 to BN are not overcharged yet (e.g., before charging or before the electric vehicle moves). While the abnormal voltage detector apparatus 600 detecting whether or not the abnormal voltage detector apparatus 600 operates normally, the control signal TC a is at Low level, and the pnp transistors 621 to 62N are turned ON. The resistor 611 is short-circuited.

First of all, in the first test processing, the pnp transistors 621 to 62N are made continuous, and the resistor 613 is grounded. If the resistor 613 is grounded, the voltage outputted to the inverted input terminal of the comparator Cn obtained by dividing the voltage (e.g., 12 V lower than 18 V) inputted to the voltage division circuit 61n including the pnp transistor 62n and the resistors 612 and 613, is equal to the reference voltage outputted from the reference voltage source An. The comparator Cn outputs information about whether or not the voltage of the battery block Bn is higher than 12 V. Since the voltage of the battery block Bn is a standard voltage of 14.4 V, the abnormal voltage detectors 601 to 60N generates the abnormality detecting signals d1 to dN each having Low level, if the reference voltage sources A1 to An, the voltage division circuits 611 to 61N, and the comparators C1 to CN are in a normal state. The logical sum signal ds is at Low level.

Next, in the second test processing, while the pnp transistors 621 to 62N are kept continuous, the resistor 614 is grounded. Next, in the third test processing, while the pnp transistors 621 to 62N are kept continuous, the resistor 615 is grounded. In each of the second and third test processings, if the reference voltage sources A1 to An, the voltage division circuits 611 to 61N, and the comparators C1 to CN are in a normal state, the abnormal voltage detectors 601 to 60N generates the abnormality detecting signals d1 to dN each having Low level. The logical sum signal ds is at Low level, in each of the second and third test processings.

The controller 450 controls the operations of the switches S11 to S1N, and S41 to S4N as the first to the third test processings. The controller 450 decides that the abnormal voltage detectors 601 to 60N operate normally, in the case that the levels of the logical sum signal ds in the above-mentioned test processings are at the same levels as the above-mentioned levels, and decides that at least one of the abnormal voltage detectors 601 to 60N is broken in other cases. The controller 450 controls a display 152 to display test results of the abnormal voltage detection functions of the abnormal voltage detectors 601 to 60$n$ by, for example, turning on a lamp.

The abnormal voltage detector apparatus 600 according to the sixth preferred embodiment exhibits advantageous effects similar to those of the abnormal voltage detector apparatus 100 according to the first preferred embodiment. Further, the abnormal voltage detector apparatus exhibits such an advantageous effect that the test of the abnormal voltage detection function can be easily conducted. In the sixth preferred embodiment, the control signal TCa outputted from the voltage lowering circuit controller 454 is a one-bit signal. If the signal TCa is a one-bit signal, only a result of collectively testing all the abnormal voltage detectors 601 to 60N is obtained. It is, therefore, preferable that the voltage lowering circuit driving signal is an n-bit signal so as to individually test all the abnormal voltage detectors 601 to 60N.

The abnormal voltage detectors 401 to 40N of the abnormal voltage detector apparatus according to the third preferred embodiment may be replaced with the abnormal voltage detectors 601 to 60N according to the sixth preferred embodiment.

The abnormal voltage detector apparatus may be configured so that one of the switch and the voltage lowering circuit switches over the reference voltages outputted from a plurality of reference voltage sources while the other switches over the voltage division ratio of the voltage division circuit.

Seventh Preferred Embodiment

Figure 16:
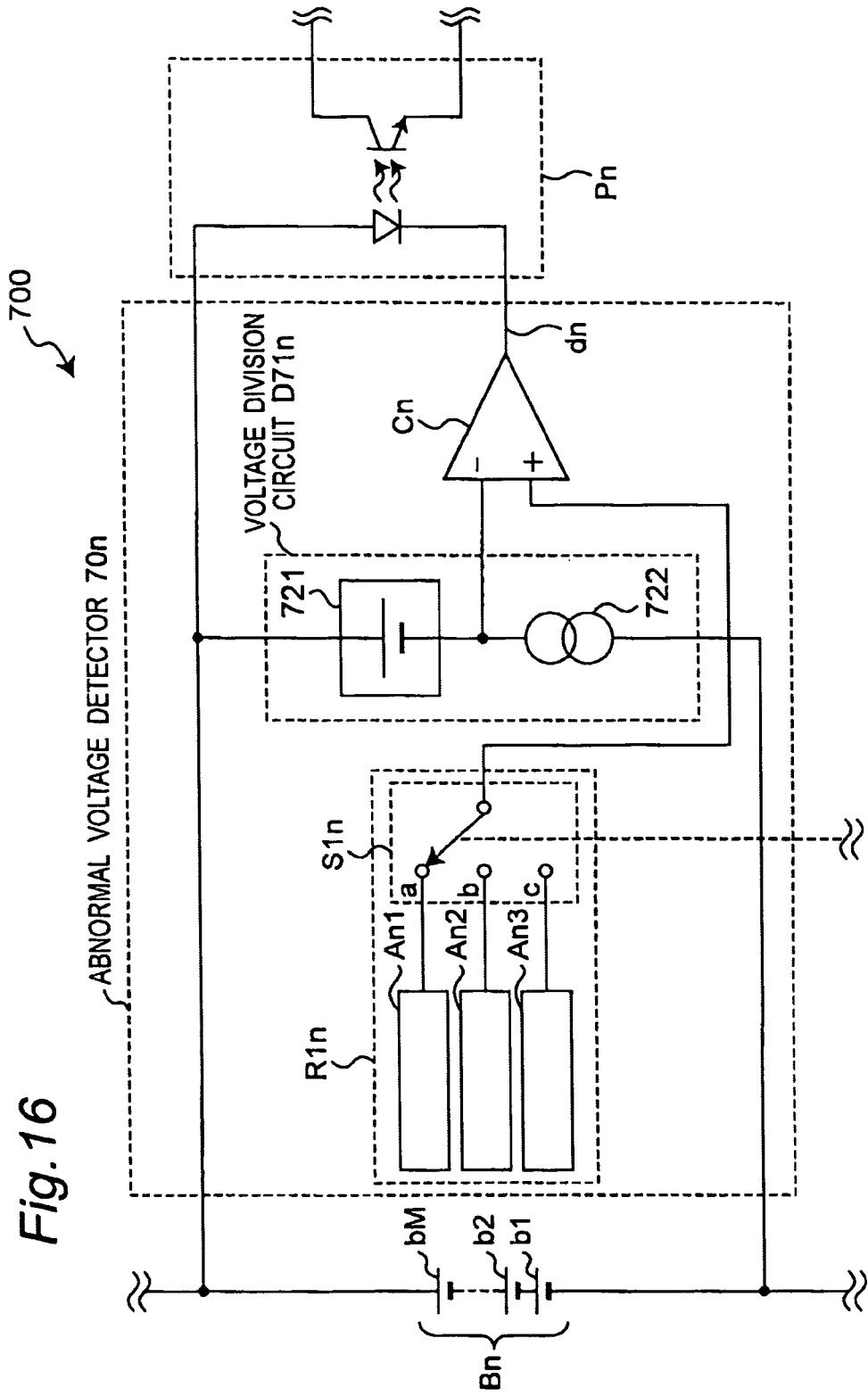
FIG. 16 is a block diagram showing a schematic configuration of a part of an abnormal voltage detector apparatus for use in the assembled battery according to a seventh preferred embodiment of the present invention.

Referring to FIG. 16, an abnormal voltage detector apparatus 700 according to a seventh preferred embodiment of the present invention will be described. The abnormal voltage detector apparatus 700 according to the seventh preferred embodiment has such a configuration that abnormal voltage detectors 101 to 10N of the abnormal voltage detector apparatus 100 according to the first preferred embodiment are replaced with abnormal voltage detectors 701 to 70N. Only configurations of the abnormal voltage detectors 701 to 70N according to the seventh preferred embodiment will be, therefore, described herein.

The abnormal voltage detectors 701 to 70N are all equal in configuration. FIG. 16 is a block diagram showing a schematic configuration of an abnormal voltage detector 70$n$ (where "n" is an arbitrary positive integer so that satisfies $1 \leq n \leq N$) of the abnormal voltage detector apparatus 700. The abnormal voltage detector 70$n$ of the abnormal voltage detector apparatus 700 has such a configuration that the voltage division circuit Dn of the abnormal voltage detector 10$n$ is replaced with a voltage division circuit D70$n$. Only a configuration of the voltage division circuit D71$n$ according to the seventh preferred embodiment will be, therefore, described.

In the first preferred embodiment, the voltage division circuits D1 to DN consist of resistors Rd1 and Rd2, respectively, and outputs voltages obtained by dividing the terminal voltages of the battery blocks B1 to Bn by the predetermined division ratio, and the obtained battery measuring voltages Vb1 to VbN are outputted to the inverted input terminals of the comparators C1 to CN, respectively. As shown in FIG. 16, the voltage division circuit D71$n$ according to the seventh preferred embodiment, by contrast, is configured so that a constant voltage source 721 and a constant current source 722 are connected in series on both ends of the battery block Bn. An electric potential of a connection point between the constant voltage source 721 and the constant current source 722 is inputted to an inverted input terminal of the comparator Cn.

The constant voltage source 721 lowers a voltage by as much as a constant voltage Vconst. If a voltage on the both ends of the battery block Bn is assumed as Vn, the voltage division circuit D71$n$ outputs a battery measuring voltage Vbn (=Vn−Vconst) to the inverted input terminal of the comparator Cn.

The constant voltage source 721 may be configured arbitrarily. For example, the constant voltage source 721 is a Zener diode or a band gap reference circuit. The constant current source 722 may be configured arbitrarily. For example, the constant current source 722 is a current mirror circuit that applies a constant current based on a reference current source or simply one resistor. By employing the constant voltage source 721, power consumption of the voltage division circuit D71$n$ can be reduced as compared with the voltage division circuit Dn consisting of the resistor. The abnormal voltage detector apparatus 700 the voltage division circuit D71$n$ hardly consumes power. Due to this, it is possible to prevent the SOC of the assembled battery 10 from being reduced and prevent the battery blocks B1 to BN from being overdischarged and power loss when, for example, the assembled battery 10 is left as it is.

In the seventh preferred embodiment, the reference voltage source An1 generates a first reference voltage Vr1 for detecting that the voltage of the battery block Bn is higher than a voltage of 18 V at which the battery block Bn is slightly overcharged. The first reference voltage Vr1 is equal to the battery measuring voltage Vbn outputted from the voltage division circuit D71$n$ that inputs an output voltage of 18 V as outputted from the battery block Bn. The reference voltage source An2 generates a second reference voltage Vr2 for detecting that the voltage of the battery block Bn is higher than a voltage of 20 V at which the battery block Bn is greatly overcharged. The second reference voltage Vr2 is equal to the battery measuring voltage Vbn outputted from the voltage division circuit D7 in that inputs an output voltage of 20 V as outputted from the battery block Bn. The reference voltage source An3 generates a third reference voltage Vr3 for detecting that the voltage of the battery block Bn is higher than a voltage of 22 V at which the battery block Bn is so overcharged that such a failure occurs that the battery block Bn is unrestored. The third reference voltage Vr3 is equal to the battery measuring voltage Vbn outputted from the voltage division circuit D71$n$ that inputs an output voltage of 23 V as outputted from the battery block Bn.

Alternatively, the abnormal voltage detector 70$n$ may be configured so that the constant current source 722 is eliminated, and that the voltage division circuit D71$n$ outputs the voltage Vbn (=Vn−Vconst) by a sink current carried to the inverted input terminal of the comparator Cn. If so, an input circuit of the comparator Cn needs to be configured to absorb an input current, and the constant voltage source 721 needs to be configured to operate normally at a feeble current. With this configuration, unnecessary current consumption can be cut back.

The voltage division circuit D71n according to the seventh preferred embodiment can also be applied to the voltage division circuits D1 to DN, D61 to D61N of the abnormal voltage detector apparatus according to the other second to sixth preferred embodiments.

Further, the configuration of the abnormal voltage detector apparatus according to the sixth preferred embodiment of FIG. 15 may be replaced by a configuration so that a plurality of constant voltage sources and constant current sources are connected in series on the both sides of the battery block Bn, and so that the respective constant voltage sources are short-circuited in response to the control signals TC1a, TC2a, and TCa. By so configuring, advantageous effects similar to those of the fifth preferred embodiment can be attained.

Eighth Preferred Embodiment

Figure 17:
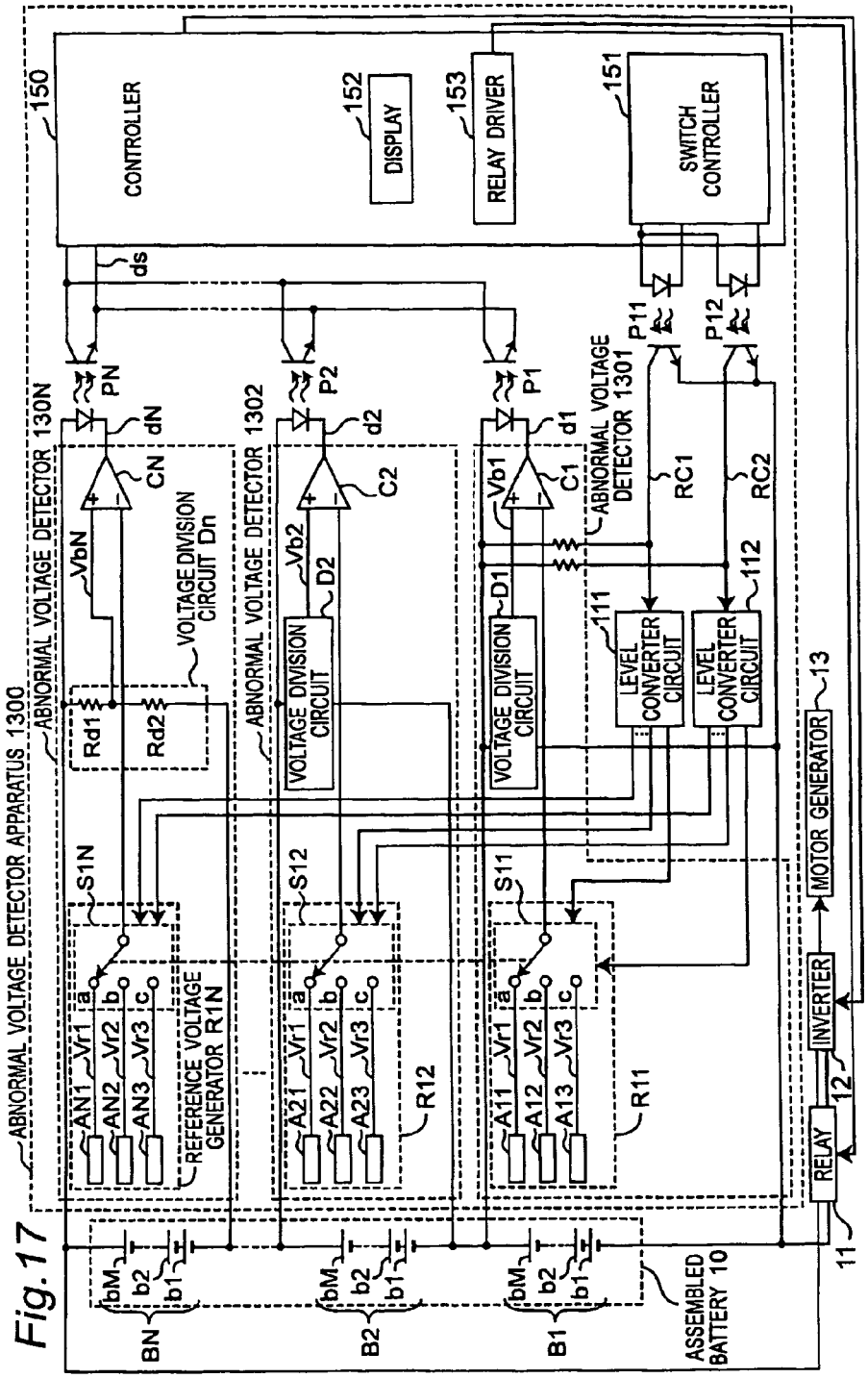
FIG. 17 is a block diagram showing a schematic configuration of a part of an abnormal voltage detector apparatus for use in the assembled battery according to an eighth preferred embodiment of the present invention.
Figure 18:
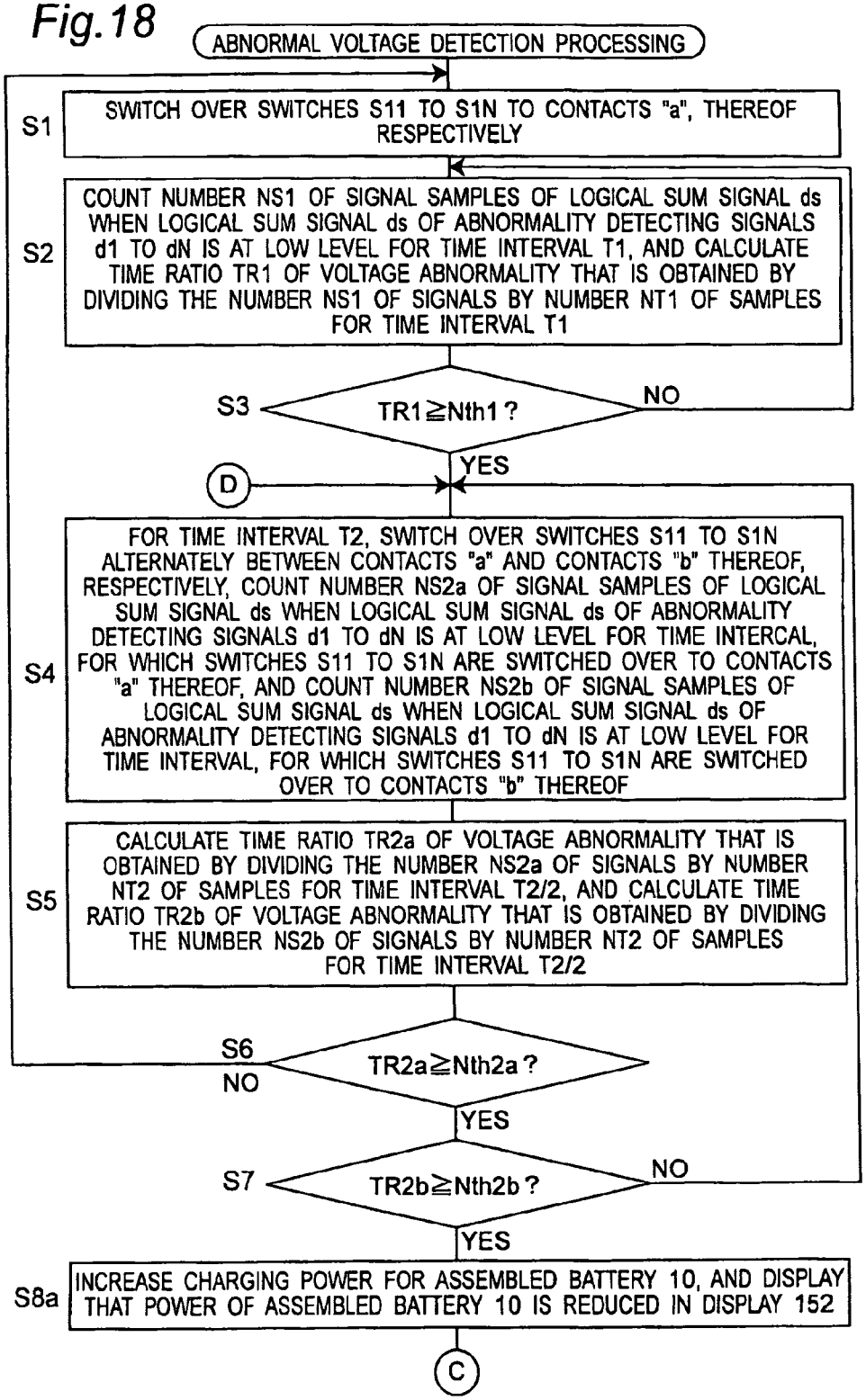
FIG. 18 is a flowchart showing a first part of an abnormal voltage detection processing executed by the abnormal voltage detector apparatuses for use in the assembled battery according to the eighth preferred embodiment of the present invention.
Figure 19:
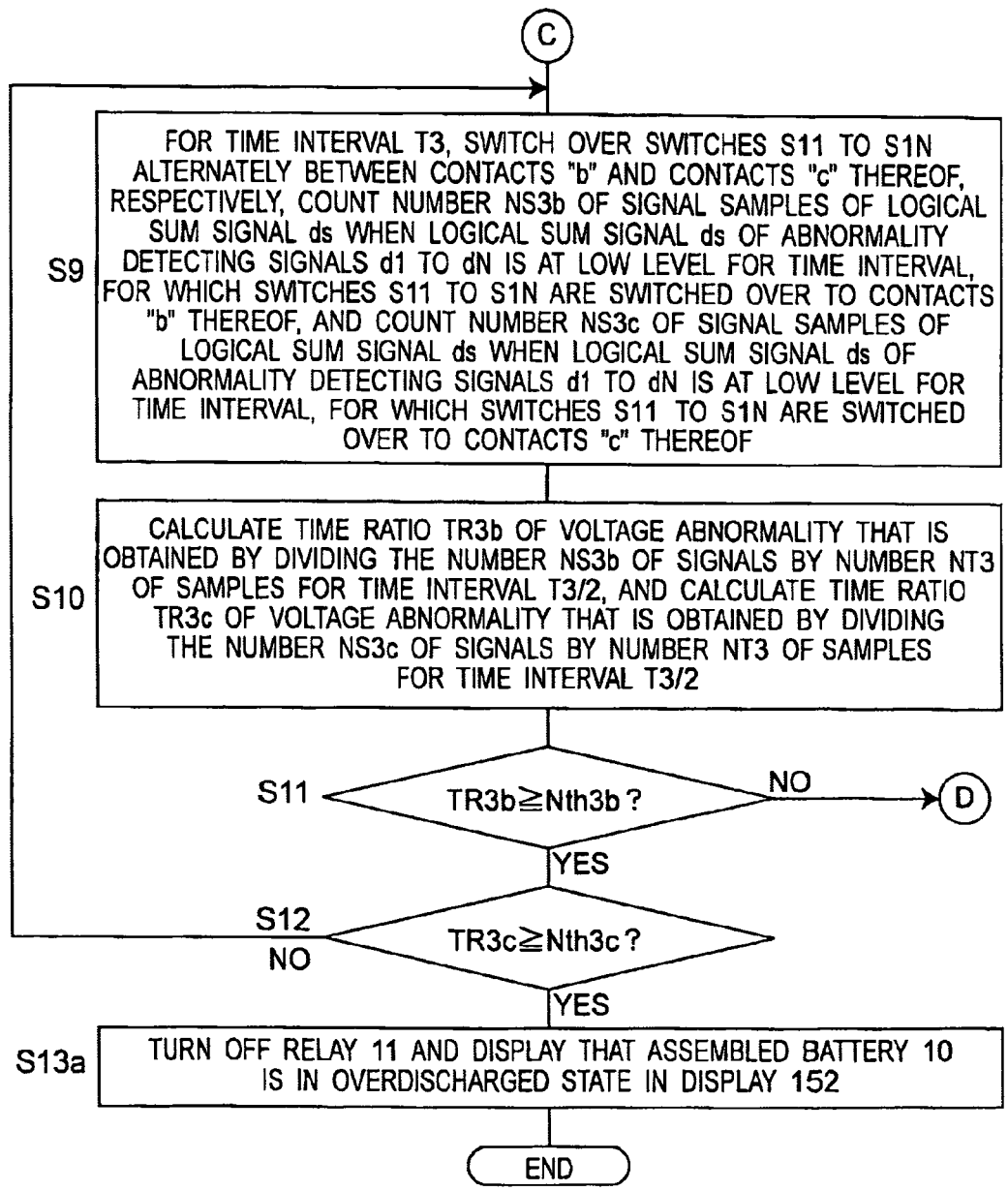
FIG. 19 is a flowchart showing a second part of the abnormal voltage detection processing executed by the abnormal voltage detector apparatuses for use in the assembled battery according to the eighth preferred embodiment of the present invention.

Referring to FIGS. 17 to 19, an abnormal voltage detector apparatus 1300 according to a eighth preferred embodiment of the present invention will be described. Each of the abnormal voltage detector apparatus according to the first to the seventh embodiments detects an overcharged state of the assembled battery 10. The abnormal voltage detector apparatus 1300 detects an overdischarged state of the assembled battery 10. FIG. 17 is a block diagram showing a schematic configuration of the abnormal voltage detector apparatus 1300 for use in the assembled battery 10 according to the eighth preferred embodiment of the present invention. In FIG. 17, components common to those shown in FIG. 1 are designated by common numerals, and their descriptions are omitted.

The abnormal voltage detector apparatus 1300 has such a configuration that the abnormal voltage detectors 101 to 10N of the abnormal voltage detector apparatus 100 are replaced with abnormal voltage detectors 1301 to 130N.

The configuration of the abnormal voltage detector 130N is described. The abnormal voltage detector 130N includes the reference voltage generator R1N, the voltage division circuit DN, and the comparator CN. The abnormal voltage detector 130N detects whether or not a voltage of the battery block BN is abnormal. In the eighth preferred embodiment, the abnormal voltage detector 130N detects such a state that the battery block BN is overdischarged. The voltage division circuit DN is a series connection of a resistor Rd1 and a resistor Rd2. The voltage division circuit DN outputs a battery measuring voltage VbN, which is lowered from a voltage of the battery block BN by dividing the terminal voltage of the battery block BN, to the non-inverted input terminal of the comparator CN. In the eighth preferred embodiment, the voltage division circuit DN divides the terminal voltage of the battery block BN into a quarter thereof.

The reference voltage generator R1N includes reference voltage sources AN1, AN2, and AN3 and switch S1N. In the eighth preferred embodiment, the reference voltage source AN1 generates a first reference voltage Vr1 for detecting that the voltage of the battery block BN is lower than a voltage of 10V at which the battery block BN is slightly overdischarged. The first reference voltage Vr1 is equal to the battery measuring voltage VbN outputted from the voltage division circuit DN that inputs an output voltage of 10V as outputted from the battery block B1N. The reference voltage source AN2 generates a second reference voltage Vr2 for detecting that the voltage of the battery block BN is lower than a voltage of 8 V at which the battery block BN is greatly overdischarged. The second reference voltage Vr2 is equal to the battery measuring voltage VbN outputted from the voltage division circuit DN that inputs an output voltage 8 V outputted from the battery block B1N. The reference voltage source AN3 generates a third reference voltage Vr3 for detecting that the voltage of the battery block BN is lower than a voltage of 6 V at which the battery block BN is so overdischarged that such a failure occurs that the battery block BN is unrestored. The third reference voltage Vr3 is set to be equal to the battery measuring voltage VbN outputted from the voltage division circuit DN that inputs an output voltage 6 V outputted from the battery block BN. In the first preferred embodiment, it is preferably set that Vr1>Vr2>Vr3.

The switch S1N is switched over in response to a two-bit control signal from the controller 150 to one of contacts "a", "b" and "c" thereof, and selectively inputs the reference voltage outputted from one of the reference voltage sources AN1, AN2, and AN3 to an inverted input terminal of the comparator CN. The comparator CN of a differential circuit is driven by the voltage of the battery block BN. The battery measuring voltage VbN outputted from the voltage division circuit DN is applied to the non-inverted input terminal of the comparator CN. The comparator CN compares the battery measuring voltage VbN of the battery block BN with one of reference voltages Vr1, Vr2 and Vr3, generates an abnormality detecting signal dN containing information about a detected result, and outputs it to the photo-coupler PN. An anode of an input light emitting diode (LED) of the photo-coupler PN is connected to a positive electrode of the battery block BN, and a cathode thereof is connected to an output terminal of the comparator CN.

The abnormal voltage detectors 1301 to 130(N−1) have configurations similar to that of the abnormal voltage detector 130N. Reference voltage sources A11 to AN1 generate the first reference voltages Vr1 equal to output voltages Vb1 to VbN outputted from voltage division circuits D1 to DN that input the voltage of 10V outputted from the battery blocks B1 to BN, respectively. Reference voltage sources A12 to AN2 generate the second reference voltages Vr2 equal to output voltages Vb1 to VbN outputted from the voltage division circuits D1 to DN that input the voltage of 8V outputted from the battery blocks B1 to BN, respectively. Reference voltage sources A13 to AN3 generate the third reference voltages Vr3 equal to output voltages Vb1 to VbN outputted from the voltage division circuits D1 to DN that input the voltage of 6V outputted from the battery blocks B1 to BN, respectively. The voltage division circuits D1 to DN are equal in voltage division ratio. The comparators C1 to CN are driven by the voltages of the corresponding battery blocks B1 to BN, respectively. The reference voltage sources A11 to AN1, A12 to AN2, and A13 to AN3 and switches S11 to S1N are driven by the voltages of the corresponding battery blocks B1 to BN, respectively.

The switches S11 to S1N are switched over simultaneously in response to the two-bit control signal from the controller 150. Reference voltages Vr1, Vr2 or Vr3 is applied to each of inverted input terminals of the comparators C1 to CN at the same time. Each of the comparators C1 to CN generates the abnormality detecting signal having Low level, when the battery measuring voltage outputted from the corresponding voltage division circuit is lower than the reference voltage selected by the corresponding switch, and generates the abnormality detecting signal having High level, in the reverse case. The comparators C1 to CN output abnormality detecting signals d1 to dN to the photo-couplers P1 to PN, respectively.

The abnormality detector apparatus 1300 generates the logical sum signal ds of the abnormality detecting signals d1 to dN in a manner similar to that of the abnormality detector apparatus 100. The logical sum signal ds is at Low level when the assembled battery 10 is in a voltage abnormality state that the battery measuring voltage of at least one of the battery blocks B1 to BN is lower than the reference voltage, that is generated by the reference voltage source selected by the switches S11 to S1N. The logical sum signal ds is at High level when the assembled battery is not in the voltage abnormality state.

Referring to FIGS. 18 and 19, the abnormal voltage detection method will be described. FIGS. 18 and 19 are flowcharts showing an abnormal voltage detection processing executed by the abnormal voltage detector apparatus 1300 for use in the assembled battery 10 according to the eighth preferred embodiment of the present invention. The flowchart shown in FIGS. 18 and 19 has such steps S1 to S7, S8a, S9 to S12, and S13a that steps S8 and S13 of FIGS. 3 and 4 are replaced with steps S8a and S13a, respectively. Only differences between abnormal voltage detection methods executed by the abnormal voltage detector apparatus 1300 and the abnormal voltage detector apparatus 100 are described below.

The time ratio TR1 of voltage abnormality calculated in step S2 is equivalent to the ratio of the voltage abnormality time interval, for which the battery measuring voltage of at least one of the battery blocks B1 to BN is lower than the reference voltage Vr1, to the time interval T1. In step S3, the controller 150 determines whether or not the assembled battery 10 is in the voltage abnormality state by whether or not the time ratio TR1 is equal to or greater than a predetermined threshold value Nth1 or not.

The time ratio TR2a of voltage abnormality calculated in step S5 is equivalent to the ratio of the voltage abnormality time interval, for which the battery measuring voltage of at least one of the battery blocks B1 to BN is lower than the reference voltage Vr1, to the time interval T2/2. The time ratio TR2b of voltage abnormality calculated in step S5 is equivalent to the ratio of the voltage abnormality time interval, for which the battery measuring voltage of at least one of the battery blocks B1 to BN is lower than the reference voltage Vr2, to the time interval T2/2. In steps S6 and S7, when the controller 150 detects the voltage abnormality of the assembled battery 10 by comparing each of battery measuring voltages Vb1 to VbN with the first reference voltage Vr1, the controller 150 detects the voltage abnormality of the assembled battery 10 by comparing each of the battery measuring voltages Vb1 to VbN with the second reference voltage Vr2, which is lower than the first reference voltage Vr1.

In step S8a of FIG. 18, the controller 150 controls the inverter 12 to increase charging power for the assembled battery 10. For example, the controller 150 controls the inverter 12 so that the motor generator 13 operates as a generator and charges the assembled battery 10 the generated electric power. Further, the display 152 turns on, for example, a yellow lamp to display that the battery is greatly overdischarged.

The time ratio TR3b of voltage abnormality calculated in step S10 is equivalent to the ratio of the voltage abnormality time interval, for which the battery measuring voltage of at least one of the battery blocks B1 to BN is lower than the reference voltage Vr2, to the time interval T3/2. The time ratio TR3c of voltage abnormality is equivalent to the ratio of the voltage abnormality time interval, for which the battery measuring voltage of at least one of the battery blocks B1 to BN is lower than the reference voltage Vr3, to the time interval T3/2. In steps S11 and S12, when the controller 150 detects the voltage abnormality of the assembled battery 10 by comparing each of battery measuring voltages Vb1 to VbN with the second reference voltage Vr2, the controller 150 detects the voltage abnormality of the assembled battery 10 by comparing each of the battery measuring voltages Vb1 to VbN with the third reference voltage Vr3, which is lower than the second reference voltage Vr2.

In step S13a of FIG. 19, the relay driver 153 turns off the relay 11 to cut the power supply from the assembled battery 10 to the motor generator 13. In addition, the display 152 turns on, for example, a red lamp to display that the assembled battery 10 is in an overdischarged state.

The abnormal voltage detector apparatus 1300 for use in the assembled battery 10 according to the eighth preferred embodiment compares the battery measuring voltage Vb1 to VbN, each of which is lowered from the voltage of the battery block by dividing the terminal voltage of the battery block, with the three reference voltages Vr1, Vr2 and Vr3, respectively, detects whether or not each of battery blocks B1 to BN is in a voltage abnormality state, and generates the abnormality detecting signals d1 to dN each of which contains information about a detected result. Then, upon detecting the voltage abnormality by using each of the reference voltages Vr1, Vr2 and Vr3, the abnormal voltage detector apparatus 1300 calculates the time ratio of a time interval, for which the assembled battery 10 is in the voltage abnormality state, to a predetermined time interval based on the logical sum signal ds of the abnormality detecting signals d1 to dN, and detects the voltage abnormality of the assembled battery 10 based on the time ratio. The display 152 displays the states of the assembled battery 10 to the user upon using the respective reference voltage. The abnormal voltage detector apparatus 1300 changes the reference voltage to stepwise detect the voltage abnormality of the assembled battery 10. Accordingly, the accuracy of detecting the voltage abnormality can be increased.

Alternatively, the abnormal voltage detector apparatus may include four or more reference voltages. The abnormal voltage detector apparatus 1300 automatically sets an appropriate reference voltage according to a present state of each battery block, and promptly detects a change in the state of the battery block. The abnormal voltage detector apparatus 100 has such an advantageous effect as preventing the battery blocks from being overdischarged.

In the above-mentioned preferred embodiments, the pnp and npn transistors may be replaced with other switching devices, respectively. In the above-mentioned embodiments, N-channel MOS field effect transistors and P-channel MOS field effect transistors may be used instead of npn transistors and pnp transistors.

In the preferred embodiments, the reference voltage source is configured to include the Zener diode. Alternatively, the reference voltage source may be configured to include a band gap reference circuit. By so configuring, the power consumption of the reference voltage source can be reduced.

In the preferred embodiments, the photo-couplers are employed as transmission elements each of which has the input terminal and the output terminal isolated from each other and each of which transmits a signal. Alternatively, the other transmission element may be employed. It is thus possible to use, for example, a combination of a magnetism generating circuit and a magnetism detection device, and a transformer, the primary and secondary windings of which are electrically insulated from each other. Since the transformer cannot transmit DC components, a method for transmitting essential data and complementary data in series, for example, is used. When the abnormal voltage detection apparatus according to the present invention is installed in an electric vehicle, a photo-coupler not affected by disturbance, such as magnetism, is used. Furthermore, a photo-coupler, the light-emitting diode and the phototransistor of which are accommodated in separate packages (not integrated into one unit), is used preferably.

Each cell of the assembled battery 10 may be a battery other than a nickel-hydrogen battery. For example, the assembled battery 10 may be formed of lead-acid batteries, nickel-cadmium batteries or lithium-ion secondary batteries.

The abnormal voltage detector apparatus according to each of the preferred embodiments is installed in the electric vehicle. Alternatively, the abnormal voltage detector apparatus may be installed in a device driven by the assembled battery used as the power source other than the electric vehicle.

As a failure or a deterioration mode of the battery blocks, an increase of an internal resistance, a cell short-circuit, or the like due to a life or a missing cell case may be considered. In any case, the voltage of the battery block is either higher or lower than that of a normal cell, so that the failure or deterioration mode can be detected as a voltage behavior similar to the overcharge or overdischarge.

The abnormal voltage detection apparatus for use in an assembled battery according to the present invention is useful for use in electric vehicles, such as pure electric vehicles (PEVs), hybrid electric vehicles (HEVs) and hybrid vehicles having fuel cells and secondary batteries.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart there from.

What is claimed is:

1. An abnormal voltage detector apparatus for use in an assembled battery comprising a plurality of battery blocks connected in series to each other, said abnormal voltage detector apparatus detecting voltage abnormality in said assembled battery, each battery block comprising at least one secondary battery, said abnormal voltage detector apparatus comprising:

a detecting part for detecting whether or not each of said battery blocks is in a voltage abnormality state by comparing either one of a voltage of said each battery block and each battery measuring voltage, which is a voltage lowered from the voltage of said each battery block, with a predetermined reference voltage, for generating each of abnormality detecting signals containing information about a detected result, for calculating a time ratio of a time interval, for which said assembled battery is in a voltage abnormality state, to a predetermined time interval, based on the abnormality detecting signals, and for detecting a voltage abnormality of said assembled battery based on a calculated time ratio, wherein said detecting part includes:

voltage changing circuits, each changing either one of each of the battery measuring voltages of said each battery block and the reference voltage;

a signal generator for generating a serial signal including control signals for controlling an operation of each of said voltage changing circuits;

a serial-parallel converter for converting the serial signal into parallel signals; and a level converter circuit for converting a voltage level of each of voltage levels of at least one of the control signals of the parallel signals into each of converted voltage levels thereof, which is a voltage level of said each battery block, respectively, by utilizing voltage differences each between electrodes of each transistor, and for outputting the parallel signals having converted voltage levels to the voltage changing circuits as the control signals.

2. The abnormal voltage detector apparatus as claimed in claim 1, wherein:

voltage levels of the parallel signals include a voltage of negative terminal of said assembled battery; and said level converter circuit boosts each of voltage levels of the parallel signals stepwise by a unit voltage, which is a voltage between the terminals of each of said battery blocks, to convert the voltage levels thereof into each of the converted voltage levels, respectively.

3. The abnormal voltage detector apparatus as claimed in claim 1, wherein:

voltage levels of the parallel signals include a voltage of a negative terminal of said assembled battery; and said level converter circuit comprises:

a first booster circuit for boosting the voltage level of the parallel signals for a first battery block of said battery blocks only by a unit voltage, which is a voltage between the terminals of each of said battery blocks, to convert the voltage level thereof into the converted voltage level, and a second booster circuit for boosting the voltage level of the parallel signals for a second battery block of said battery blocks by the plurality of the unit voltages, to convert the voltage level thereof into the converted voltage level.

4. The abnormal voltage detector apparatus as claimed in claim 3, wherein said level converter circuit further comprises a third booster circuit for boosting the voltage level of the parallel signals for a third battery block of said battery blocks by the unit voltage and then boosting a boosted voltage level thereof by the plurality of the unit voltages to convert the voltage level thereof into the converted voltage level.

5. The abnormal voltage detector apparatus as claimed in claim 1, wherein:

the serial signal contains a start bit as a header thereof; and said serial-parallel converter automatically activates an internal oscillator in response to the start bit, and reads therein the serial signal outputted from said signal generator by using a predetermined clock outputted from the internal oscillator.

6. The abnormal voltage detector apparatus as claimed in claim 1, wherein said detecting part further comprises:

first transmission devices, each transmitting the abnormality detecting signal in an electrically insulted state; and a second transmission device for transmitting the serial signal to the serial-parallel converter in an electrically insulted state.

7. The abnormal voltage detector apparatus as claimed in claim 1, wherein said detecting part relatively changes either one of each of the battery measuring voltages of said each battery block and the reference voltage, generates each of the abnormality detecting signals by comparing each of battery measuring voltages with the reference voltage, and detects whether or not said detecting part operates normally based on the abnormality detecting signals.

* * * * *